US010971333B2

(12) United States Patent
Lee et al.

(10) Patent No.: US 10,971,333 B2
(45) Date of Patent: Apr. 6, 2021

(54) ANTENNAS, CIRCUITS FOR GENERATING PLASMA, PLASMA PROCESSING APPARATUS, AND METHODS OF MANUFACTURING SEMICONDUCTOR DEVICES USING THE SAME

(71) Applicant: Samsung Electronics Co., Ltd., Suwon-si (KR)

(72) Inventors: Dong-Hyub Lee, Seoul (KR); Dougyong Sung, Seoul (KR); Je-Hun Woo, Suwon-si (KR); Bongseong Kim, Yongin-si (KR); Juho Lee, Suwon-si (KR); Yun-Kwang Jeon, Seoul (KR); Junghyun Cho, Suwon-si (KR)

(73) Assignee: Samsung Electronics Co., Ltd.

( * ) Notice: Subject to any disclaimer, the term of this patent is extended or adjusted under 35 U.S.C. 154(b) by 463 days.

(21) Appl. No.: 15/723,837

(22) Filed: Oct. 3, 2017

(65) Prior Publication Data

US 2018/0114675 A1 Apr. 26, 2018

(30) Foreign Application Priority Data

Oct. 24, 2016 (KR) .................... 10-2016-0138589
Aug. 3, 2017 (KR) .................... 10-2017-0098634

(51) Int. Cl.
*H01J 37/32* (2006.01)
*H01L 21/67* (2006.01)

(52) U.S. Cl.
CPC ..... *H01J 37/3211* (2013.01); *H01J 37/32119* (2013.01); *H01J 37/32174* (2013.01); *H01J 37/32183* (2013.01); *H01L 21/67069* (2013.01)

(58) Field of Classification Search
USPC ........ 118/723 I, 723 IR; 156/345.48, 345.49; 315/111.51
See application file for complete search history.

(56) References Cited

U.S. PATENT DOCUMENTS 5,525,159 A * 6/1996 Hama ................. C23C 16/4404
118/723 I
5,571,366 A * 11/1996 Ishii .................. H01J 37/32082
156/345.26

(Continued)

FOREIGN PATENT DOCUMENTS

JP      2002124399 A    4/2002
JP      2006318725 A    11/2006

(Continued)

OTHER PUBLICATIONS

Yamada et al. "Model for a Large Area Multi-Frequency Multiplanar Coil Inductively Coupled Plasma Source", *J. Vac.. Sci. Technol.* A14(5), Sep./Oct. 1996, pp. 2859-2870.

*Primary Examiner* — Rakesh K Dhingra
(74) *Attorney, Agent, or Firm* — Myers Bigel, P.A.

(57) ABSTRACT

Embodiments of the inventive concepts provide antennas, plasma generating circuits, plasma processing apparatus, and methods for manufacturing semiconductor devices using the same. The circuits include radio-frequency power sources generating radio-frequency powers, antennas receiving the radio-frequency powers to generate plasma and having a first mutual inductance, and inductors connecting the antennas to the radio-frequency power sources, respectively. The inductors have a second mutual inductance reducing and/or canceling the first mutual inductance.

17 Claims, 21 Drawing Sheets

(56) References Cited

U.S. PATENT DOCUMENTS

| | | |
|---|---|---|
| 5,800,619 A | 9/1998 | Holland et al. |
| 5,874,704 A | 2/1999 | Gates |
| 6,181,069 B1* | 1/2001 | Tonotani .................. H05H 1/46 |
| | | 315/111.51 |
| 6,694,915 B1* | 2/2004 | Holland ................ H01J 37/321 |
| | | 118/715 |
| 7,880,392 B2 | 2/2011 | Kato et al. |
| 8,076,247 B2 | 12/2011 | Collins et al. |
| 8,349,202 B2 | 1/2013 | Fang et al. |
| 8,368,308 B2 | 2/2013 | Banna et al. |
| 9,119,282 B2 | 8/2015 | Yamazawa |
| 9,161,428 B2 | 10/2015 | Collins et al. |
| 9,218,943 B2 | 12/2015 | Yamazawa |
| 9,312,106 B2 | 4/2016 | Kobayashi et al. |
| 9,378,930 B2 | 6/2016 | Grimbergen et al. |
| 2007/0084405 A1* | 4/2007 | Kim ....................... H01J 37/321 |
| | | 118/723 I |
| 2008/0197780 A1* | 8/2008 | Yamazawa ........ H01J 37/32091 |
| | | 315/111.21 |
| 2009/0139963 A1 | 6/2009 | Panagopoulos et al. |
| 2011/0097901 A1* | 4/2011 | Banna .................... H01J 37/321 |
| | | 438/710 |
| 2012/0074100 A1* | 3/2012 | Yamazawa ........ H01J 37/32174 |
| | | 216/68 |
| 2012/0325404 A1* | 12/2012 | Tsunoda ................ H01J 37/321 |
| | | 156/345.1 |
| 2013/0105086 A1 | 5/2013 | Banna et al. |
| 2014/0020838 A1* | 1/2014 | Kenney ................ H01J 37/3211 |
| | | 156/345.48 |
| 2014/0144584 A1* | 5/2014 | Koo ..................... H01J 37/3211 |
| | | 156/345.48 |
| 2015/0068681 A1 | 3/2015 | Tetsuka et al. |
| 2015/0097478 A1* | 4/2015 | Knyazik ............... H01J 37/3211 |
| | | 315/34 |
| 2016/0155613 A1 | 6/2016 | Yamazawa |
| 2016/0203951 A1 | 7/2016 | Yamazawa et al. |

FOREIGN PATENT DOCUMENTS

| | | |
|---|---|---|
| JP | 2013258409 A | 12/2013 |
| KR | 20120032436 | 4/2012 |

* cited by examiner

ANTENNAS, CIRCUITS FOR GENERATING PLASMA, PLASMA PROCESSING APPARATUS, AND METHODS OF MANUFACTURING SEMICONDUCTOR DEVICES USING THE SAME

CROSS-REFERENCE TO RELATED APPLICATION

This U.S. non-provisional patent application claims priority under 35 U.S.C. § 119 to Korean Patent Application No. 10-2016-0138589, filed on Oct. 24, 2016, and to Korean Patent Application No. 10-2017-0098634, filed on Aug. 3, 2017, in the Korean Intellectual Property Office, the entire contents of which are hereby incorporated herein by reference.

BACKGROUND

Embodiments of the inventive concepts relate to apparatus and methods for manufacturing semiconductor devices and, more particularly, to antennas for inducing plasma, circuits for generating plasma, plasma processing apparatus, and methods of manufacturing semiconductor devices using the same.

In general, a semiconductor device may be manufactured by a plurality of unit processes. The unit processes may include a deposition process, a diffusion process, a thermal treatment process, a photolithography process, a polishing process, an etching process, an ion implantation process, and/or a cleaning process. The etching process of these unit processes may include a dry etching process and/or a wet etching process. The dry etching process may be performed using plasma. A substrate may be treated or processed at a high temperature by the plasma.

SUMMARY

Embodiments of the inventive concepts may provide plasma generating circuits and plasma processing apparatus, which are capable of stably matching impedance.

Embodiments of the inventive concepts may also provide antennas capable of inducing uniform plasma.

In an aspect of the inventive concepts, a plasma generating circuit may include first and second radio-frequency power sources configured to generate first and second radio-frequency powers, first and second antennas configured receive the first and second radio-frequency powers to generate plasma and having a first mutual inductance, and first and second inductors electrically connecting the first and second antennas to the first and second radio-frequency power sources, respectively. The first and second inductors may have a second mutual inductance to cancel the first mutual inductance.

In an aspect of the inventive concepts, a plasma processing apparatus may include a chamber, a gas supply part configured to provide a reaction gas into the chamber, and a plasma generating circuit on the chamber and configured to induce plasma of the reaction gas in the chamber. The plasma generating circuit may include first and second radio-frequency power sources configured to generate first and second radio-frequency powers, first and second antennas configured to generate the plasma by using the first and second radio-frequency powers, the first and second antennas having a first mutual inductance, and first and second inductors configured to couple the first and second antennas to the first and second radio-frequency power sources, respectively. The first and second inductors may have a second mutual inductance to cancel the first mutual inductance.

In an aspect of the inventive concepts, a plasma generating circuit may include radio-frequency power sources configured to generate radio-frequency powers, matching circuits connected to the radio-frequency power sources, respectively, the matching circuits configured to match impedances of the radio-frequency powers, respectively, antennas connected to the matching circuits, respectively, the antennas configured to generate plasma by using the radio-frequency powers, and the antennas having a first mutual inductance, capacitors configured to ground the antennas, respectively, the capacitors configured to control impedances of the radio-frequency powers, and inductors connected between the antennas and the matching circuits, respectively. The inductors may have a second mutual inductance to cancel the first mutual inductance.

In an aspect of the inventive concepts, an antenna may include an input electrode, branch electrodes connected to the input electrode, coil electrodes connected to the branch electrodes, respectively, the coil electrodes extending along an imaginary circle connecting ends of the branch electrodes, and output electrodes connected to the coil electrodes, respectively. The output electrodes may be disposed in parallel to the input electrode.

In an aspect of the inventive concepts, a method for manufacturing a semiconductor device may include providing a substrate, and generating plasma on the substrate. The generating of the plasma may include supplying first and second radio-frequency powers to first and second antennas disposed on a central portion and an edge portion of the substrate to etch the substrate without interference of the first and second radio-frequency powers by a second mutual inductance to cancel a first mutual inductance between the first and second antennas.

In an aspect of the inventive concepts, a plasma generating circuit for a plasma processing apparatus may include a first radio-frequency power source configured to generate a first radio-frequency power, a second radio-frequency power source configured to generate a second radio-frequency power, a first inductor configured to receive the first radio-frequency power, a first antenna coupled to the first inductor and configured to transmit the first radio-frequency power to a gas of the plasma processing apparatus, a second inductor configured to receive the second radio-frequency power, and a second antenna coupled to the second inductor and configured to transmit the second radio-frequency power to the gas of the plasma processing apparatus. The first antenna and the second antenna may be inductively coupled to one another by a first mutual inductance, and the first inductor and the second inductor may be inductively coupled to one another by a second mutual inductance configured to offset the first mutual inductance of the first antenna and the second antenna.

In an aspect of the inventive concepts, a method for manufacturing a semiconductor device may include providing first and second radio-frequency powers into first and second antennas, respectively, sweeping a current phase difference of the first and second radio-frequency powers, measuring first and second currents flowing through the first and second antennas to calculate current ratios, each of which corresponds to a ratio of the first current to the second current, determining whether a standard value exists among the current ratios, and calculating a first current phase difference of the first and second currents at the current ratio corresponding to the standard value when the standard value exists.

In an aspect of the inventive concepts, a plasma processing apparatus may include a chamber, a gas supply part providing a gas into the chamber, a plasma generating circuit including first and second antennas disposed on the chamber and first and second radio-frequency power sources providing first and second radio-frequency powers into the first and second antennas, and first and second current measuring instruments disposed between the first and second antennas and the first and second radio-frequency power sources, respectively, to measure first and second currents of the first and second radio-frequency powers, respectively. When a current ratio corresponding to a ratio of the first current to the second current is a standard value, the first and second radio-frequency power sources may provide the first and second radio-frequency powers having a first current phase difference calculated at the current ratio corresponding to the standard value.

BRIEF DESCRIPTION OF THE DRAWINGS

The inventive concepts will become more apparent in view of the attached drawings and accompanying detailed description.

DETAILED DESCRIPTION

Figure 1:
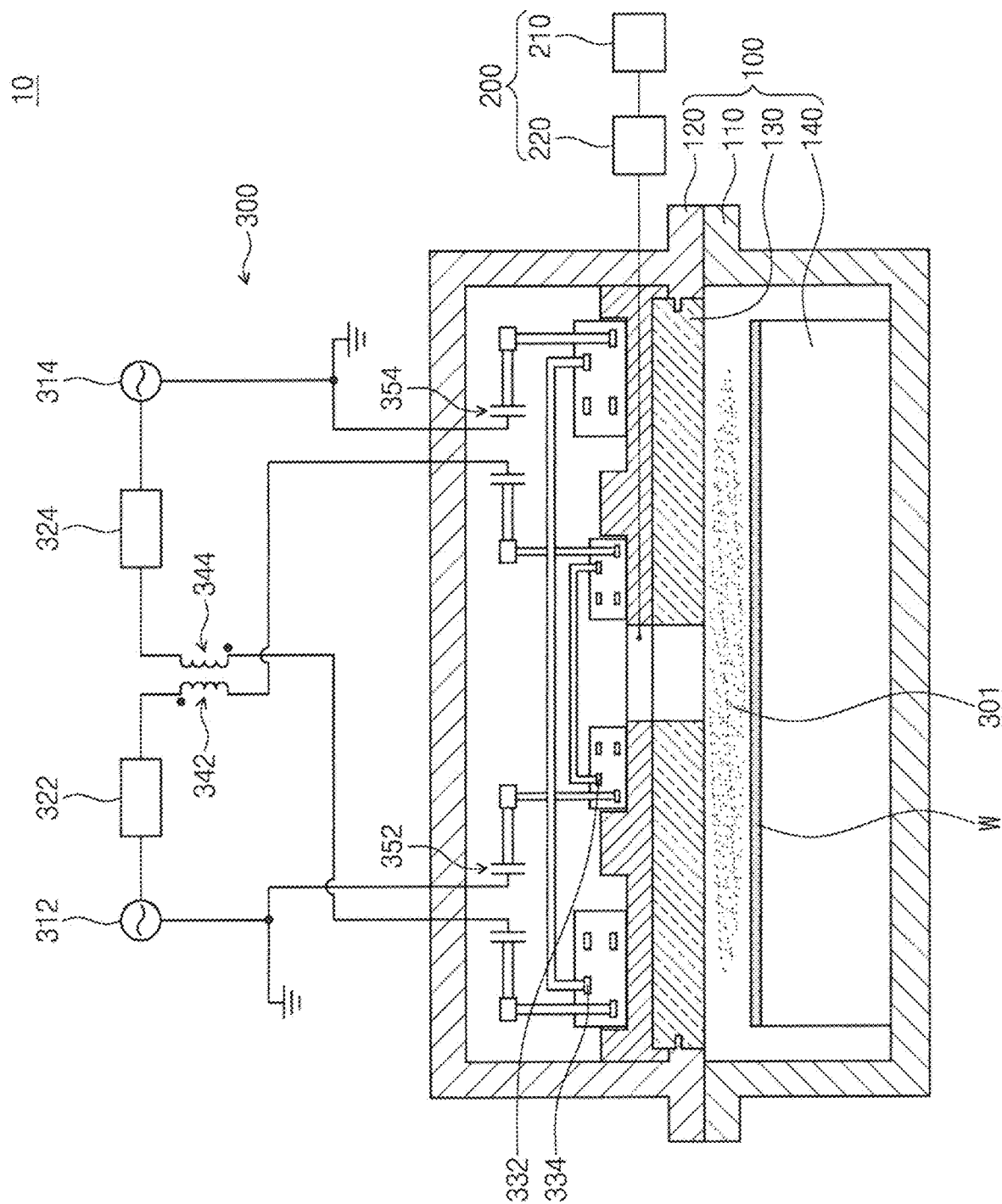
FIG. 1 is a view illustrating a plasma processing apparatus according to some embodiments of the inventive concepts.

FIG. 1 illustrates a plasma processing apparatus 10 according to some embodiments of the inventive concepts.

Referring to FIG. 1, the plasma processing apparatus 10 according to some embodiments of the inventive concepts may include an inductively coupled plasma (ICP) apparatus. In some embodiments, the plasma processing apparatus 10 may include a capacitively coupled plasma (CCP) apparatus. In some embodiments, the plasma processing apparatus 10 may include a microwave plasma apparatus. In some embodiments, the plasma processing apparatus 10 may include a chamber 100, a gas supply part 200, and a circuit 300 for generating plasma (hereinafter, referred to as "a plasma generating circuit 300").

The chamber 100 may provide an inner space into which a substrate W is loaded. The inner space of the chamber 100 may be isolated from the outside of the chamber 100 when a process is performed. In some embodiments, the chamber 100 may include a lower housing 110, an upper housing 120, a window 130, and an electrostatic chuck 140. The lower housing 110 and the upper housing 120 may surround the window 130, the electrostatic chuck 140, and a substrate W. The upper housing 120 may be disposed on the lower housing 110 and the window 130. The window 130 may be disposed between the lower housing 110 and the upper housing 120. For example, the window 130 may include a ceramic disk. The electrostatic chuck 140 may be disposed in the lower housing 110. The electrostatic chuck 140 may receive a substrate W.

The gas supply part 200 may supply a gas (not shown) into the chamber 100 between the lower housing 110 and the window 130. In some embodiments, the gas supply part 200 may include a storage tank 210 and a mass flow controller 220. The storage tank 210 may store a gas. The gas may include, for example, a purge gas, an etching gas, a deposition gas, or a reaction gas. For example, the gas may include at least one of a nitrogen ($N_2$) gas, a hydrogen ($H_2$) gas, an oxygen ($O_2$) gas, a hydrofluoric acid (HF) gas, a chlorine ($Cl_2$) gas, a sulfur hexafluoride ($SF_6$), a methylene ($CH_3$) gas, or a silane ($SiH_4$) gas. The mass flow controller 220 may be connected between the storage tank 210 and the chamber 100. The mass flow controller 220 may control a supply flow rate of the gas.

The plasma generating circuit 300 may generate or induce plasma 301 of the supplied gas in the chamber 100. For example, the plasma generating circuit 300 may be disposed on the window 130. In some embodiments, the plasma generating circuit 300 may be disposed on the upper housing 120 outside the chamber 100. The plasma 301 may be remotely induced between the lower housing 110 and the window 130. The plasma 301 may be generated on the substrate W.

Figure 2:
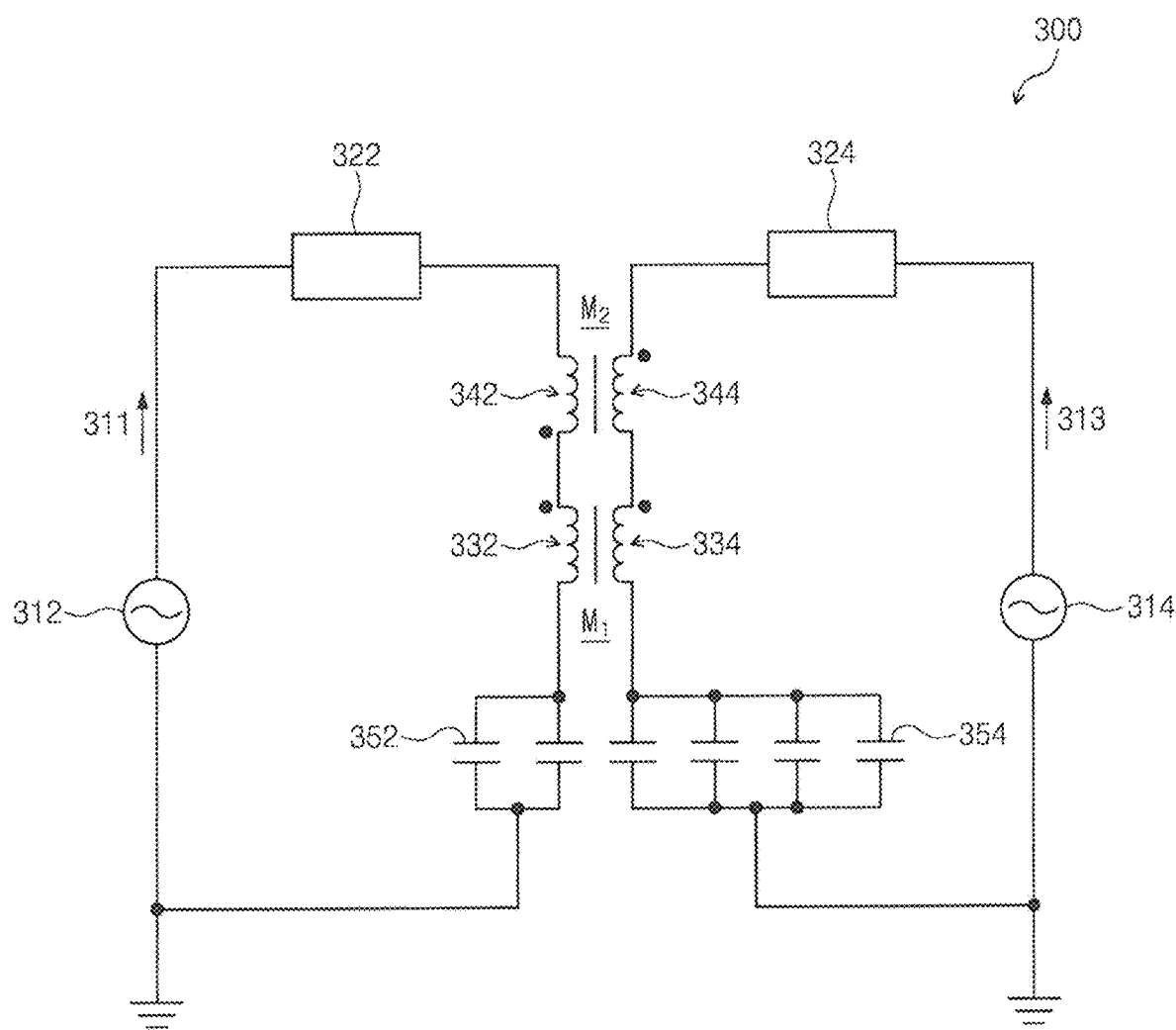
FIG. 2 is a circuit diagram illustrating an example of a plasma generating circuit of FIG. 1.

FIG. 2 is a circuit diagram illustrating an example of the plasma generating circuit 300 of FIG. 1.

Referring to FIGS. 1 and 2, the plasma generating circuit 300 may provide a first radio-frequency (RF) power 311 and a second radio-frequency (RF) power 313 to the gas disposed on a central portion of the substrate W and the gas disposed on an edge portion of the substrate W, respectively. The first and second radio-frequency powers 311 and 313 may generate the plasma 301 on the central portion and the edge portion of the substrate W. In some embodiments, the plasma generating circuit 300 may include first and second radio-frequency power sources 312 and 314, first and second matchers 322 and 324, first and second antennas 332 and 334, first and second inductors 342 and 344, and first and second capacitors 352 and 354.

The first and second radio-frequency power sources 312 and 314 may generate the first and second radio-frequency powers 311 and 313, respectively. The first and second radio-frequency powers 311 and 313 may be provided to the first and second antennas 332 and 334, respectively. The first and second radio-frequency powers 311 and 313 may be controlled independently of each other.

FIGS. 3A to 3F illustrate waveforms of the first and second radio-frequency powers 311 and 313 of the first and second radio-frequency power sources 312 and 314.

Referring to FIGS. 3A to 3F, the first and second radio-frequency powers 311 and 313 may be provided in a combination of a continuous wave and a pulse wave or in a combination of pulse waves.

Figure 3A:
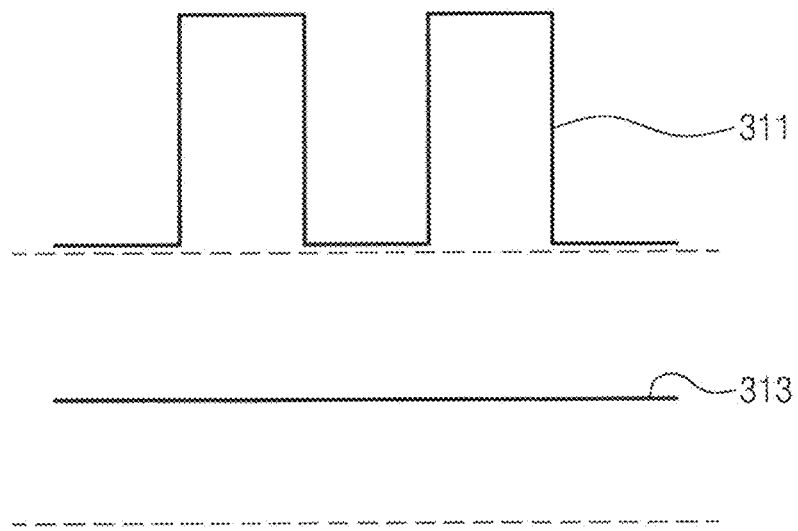
FIGS. 3A to 3F are graphs illustrating waveforms of first and second radio-frequency powers of first and second radio-frequency power sources of FIG. 2.

Referring to FIG. 3A, when the first radio-frequency power 311 is a pulse wave, the second radio-frequency power 313 may be a continuous wave. In some embodiments, the second radio-frequency power 313 may be considered a continuous wave when the second radio-frequency power 313 is a substantially constant power. In some embodiments, the first radio-frequency power 311 may be a continuous wave, and the second radio-frequency power 313 may be a pulse wave.

Figure 3B:
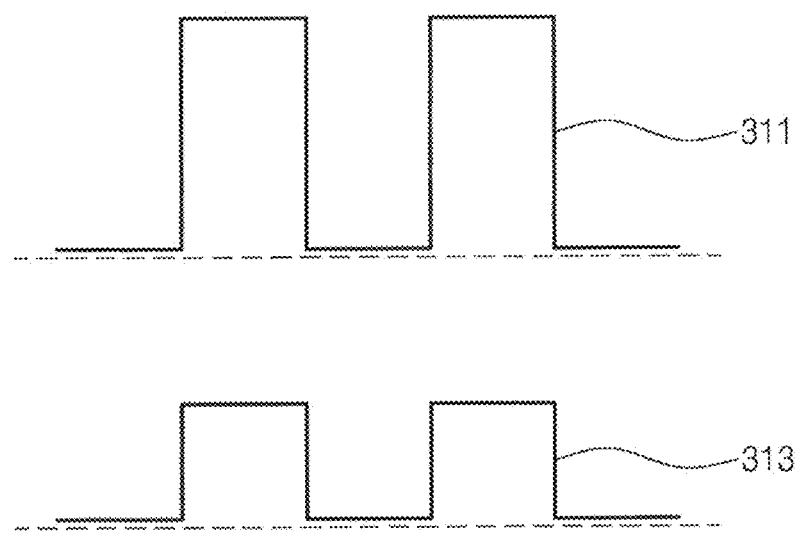

Referring to FIG. 3B, the first and second radio-frequency powers 311 and 313 may be synchronized pulses. For example, frequencies and/or phases of the first and second radio-frequency powers 311 and 313 may be equal to each other. A voltage and/or current of the first radio-frequency power 311 may be greater than a voltage and/or current of the second radio-frequency power 313. The first and second radio-frequency powers 311 and 313 may be reverse pulses.

Figure 3C:
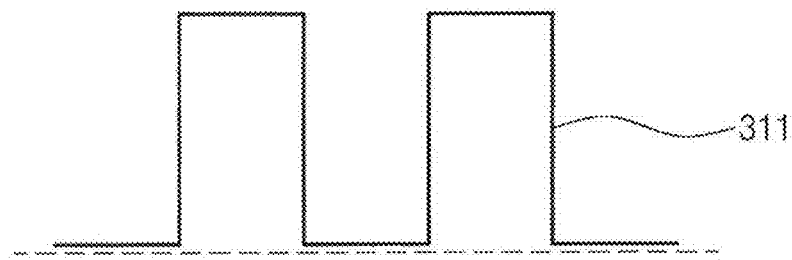
Figure 3C:
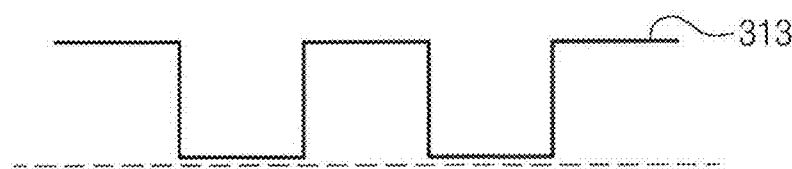

Referring to FIG. 3C, phases of the first and second radio-frequency powers 311 and 313 may be opposite to each other. For example, frequencies of the first and second radio-frequency powers 311 and 313 may be equal to each other. In some embodiments, a phase of the first and second radio-frequency powers 311 and 313 may be shifted by 180 degrees with respect to one another.

Figure 3D:
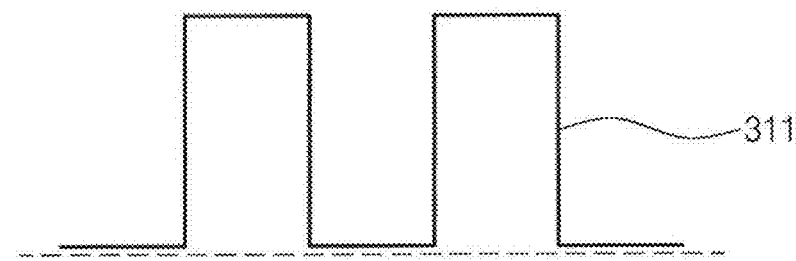
Figure 3D:
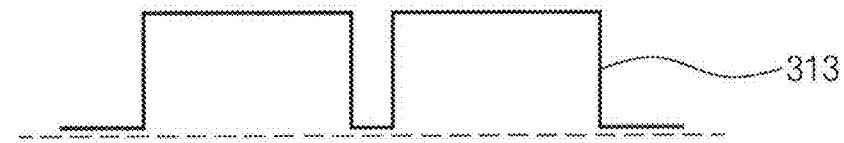

Referring to FIG. 3D, a duty cycle of each of the first and second radio-frequency powers 311 and 313 may be controlled. For example, the duty cycles of the first and second radio-frequency powers 311 and 313 may be different from each other.

Figure 3E:
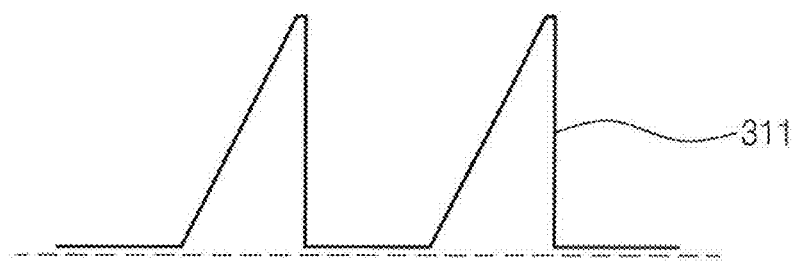
Figure 3E:
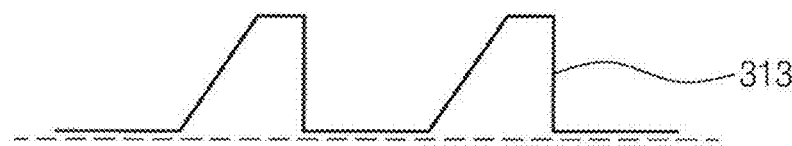

Referring to FIG. 3E, shapes of pulse waves of the first and second radio-frequency powers 311 and 313 may be changed. For example, each of the first and second radio-frequency powers 311 and 313 may be a triangular wave or a quadrilateral wave. In some embodiments, the shape of the pulse wave of the first radio-frequency power 311 and the second radio-frequency power 313 may be different from one another.

Figure 3F:
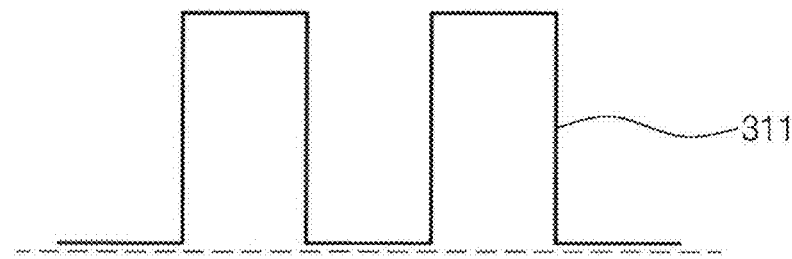
Figure 3F:
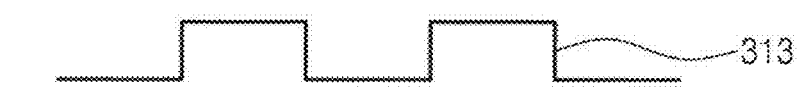

Referring to FIG. 3F, base voltage levels of pulse waves of the first and second radio-frequency powers 311 and 313 may be different from each other. For example, the first radio-frequency power 311 may have a base voltage that is equal to a ground voltage. On the other hand, the second radio-frequency power 313 may have a base voltage that is higher than the ground voltage.

It will be understood that FIGS. 3A to 3F illustrate the waveforms of the first and second radio-frequency powers 311 and 313 at respective comparative periods and are not intended to represent the waveforms of the first and second radio-frequency powers 311 and 313 in their entirety. In some embodiments, either or both of the waveforms of the first and second radio-frequency powers 311 and 313 may change to any of the respective waveforms illustrated in FIGS. 3A to 3F, or to other waveforms.

Referring again to FIG. 2, the first and second matchers 322 and 324 may be connected to the first and second radio-frequency power sources 312 and 314, respectively. The first and second matchers 322 and 324 may match impedances of the first and second radio-frequency powers 311 and 313, respectively. In some embodiments, the first matcher 322 and/or the second matchers 324 may be matching circuits.

Referring to FIGS. 1 and 2, the first and second antennas 332 and 334 may be disposed between the window 130 and the upper housing 120. In some embodiments, the first antenna 332 may be disposed over the central portion of the substrate W. The second antenna 334 may be disposed over the edge portion of the substrate W. As used herein, the central portion of the substrate W may extend beyond the exact center of the substrate W, and may be a portion of the substrate W that is closer to the exact center of the substrate W than the edge portion of the substrate W. In some embodiments, the central portion of the substrate W may include fifty percent of the surface area of the substrate W that surrounds the center of the substrate W. In some embodiments, the edge portion of the substrate W may include fifty percent of the surface area of the substrate W that surrounds the central portion. The first antenna 332 may transmit the first radio-frequency power 311, and second antenna 334 may transmit the second radio-frequency power 313, to the gas on the substrate W.

Energy and/or intensity of the plasma 301 may be proportional to the first and second radio-frequency powers 311 and 313 transmitted to the gas. In some embodiments, the energy and/or the intensity of the plasma 301 may be proportional to an etch rate of the substrate W. For example, the first antenna 332 may control an etch rate of the central portion of the substrate W by using the first radio-frequency power 311. The second antenna 334 may control an etch rate of the edge portion of the substrate W by using the second radio-frequency power 313. In some embodiments, the energy and/or the intensity of the plasma 301 may be proportional to a deposition rate of a thin film on the substrate W.

Referring to FIG. 2, the first and second antennas 332 and 334 may be disposed to be adjacent to each other. In some embodiments, the first and second antennas 332 and 334 may be coupled to each other within an adjacent distance. For example, the first and second antennas 332 and 334 may have a first mutual inductance $M_1$. Coiled directions of the first and second antennas 332 and 334 may be indicated by the dots of FIG. 2. In some embodiments, the first and second antennas 332 and 334 may be coiled and/or wound in the same direction.

Figure 4:
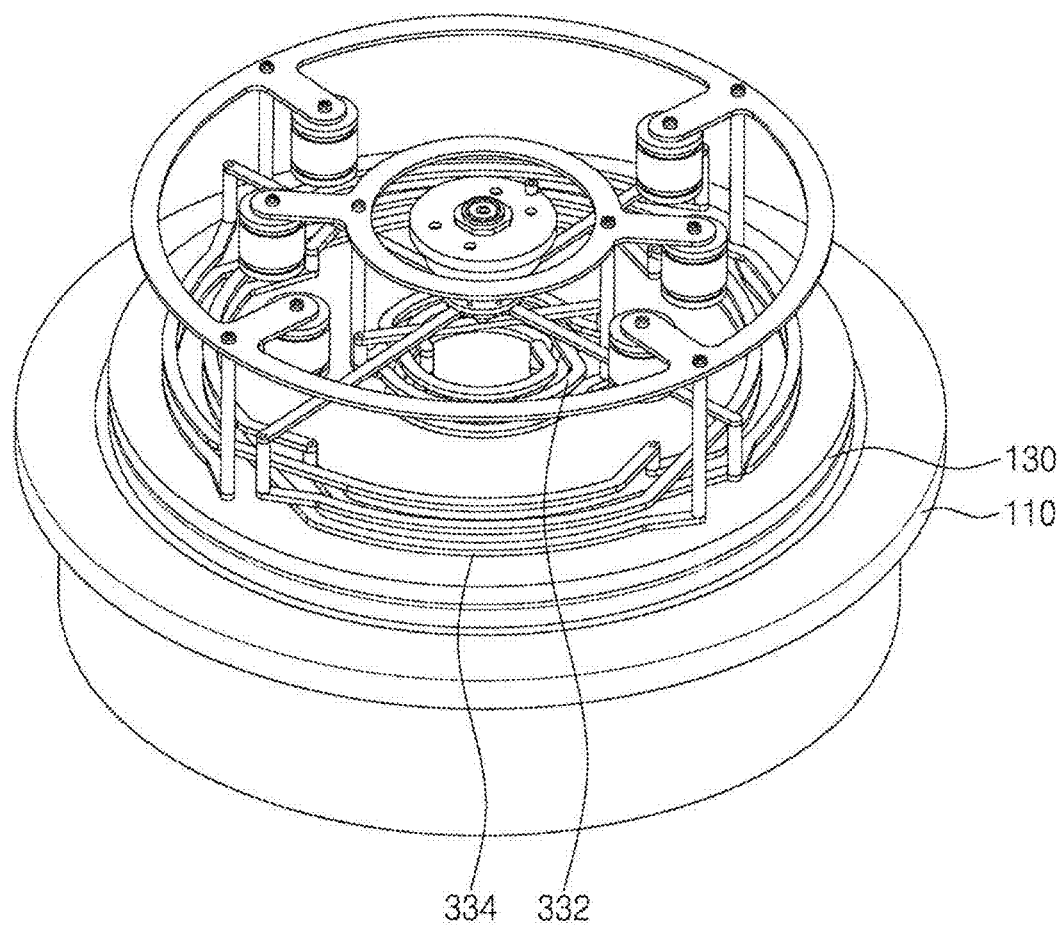
FIG. 4 is a perspective view illustrating first and second antennas of FIG. 2.

FIG. 4 illustrates the first and second antennas 332 and 334 of FIG. 2.

Referring to FIG. 4, the first antenna 332 may be disposed within an interior space of the second antenna 334. The first and second antennas 332 and 334 may have shapes similar to each other. For example, the first and second antennas 332 and 334 may have ring shapes. In some embodiments, the first and second antennas 332 and 334 may have shapes different from each other.

Figure 5:
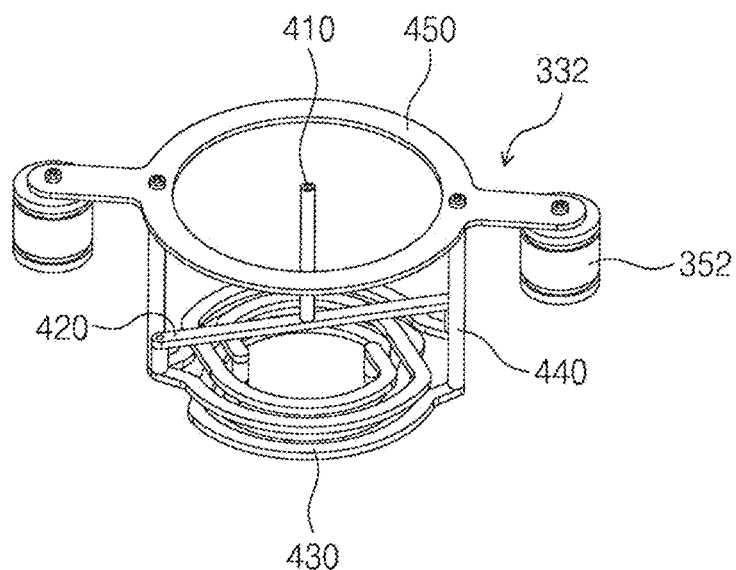
FIG. 5 is a perspective view illustrating the first antenna of FIG. 4.
Figure 6:
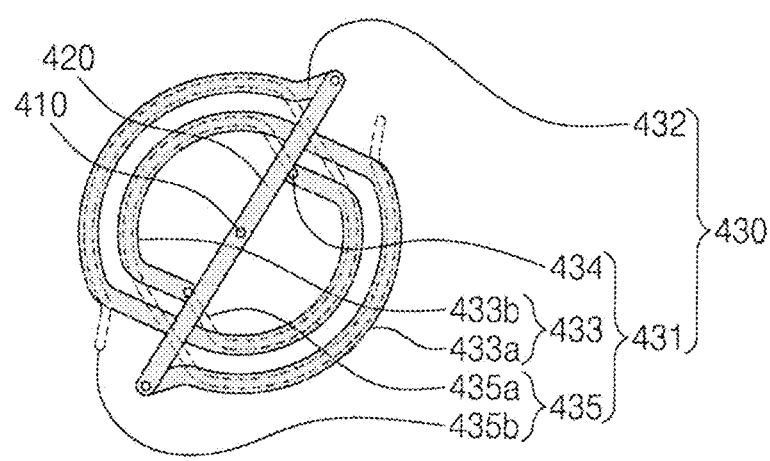
FIG. 6 is a plan view illustrating a first input electrode, first branch electrodes, and first coil electrodes of FIG. 5.

FIG. 5 illustrates the first antenna 332 of FIG. 4. FIG. 6 is a plan view illustrating a first input electrode 410, first branch electrodes 420, and first coil electrodes 430 of FIG. 5.

Referring to FIG. 5, the first antenna 332 may include a first input electrode 410, first branch electrodes 420, first coil electrodes 430, first output electrodes 440, and a first ring electrode 450.

The first input electrode 410 may be disposed on a center at which the first branch electrodes 420 meet each other. The first input electrode 410 may be parallel to a direction vertical to the first branch electrodes 420 and the first coil electrodes 430.

Referring to FIGS. 5 and 6, the first branch electrodes 420 may be connected to the first input electrode 410. For example, the number of the first branch electrodes 420 may be two. The first branch electrodes 420 may extend from the first input electrode 410 in directions opposite to each other. The first branch electrodes 420 may divide the first coil electrodes 430 at a rotation angle of 180 degrees.

The first coil electrodes 430 may be connected to end portions of the first branch electrodes 420, respectively. In some embodiments, end portions of the first branch electrodes 420 may be portions of the first branch electrodes 420 that are disposed at ends of the first branch electrodes 420 that are opposite from the first input electrode 410. In some embodiments, the first coil electrodes 430 may be wound from the first branch electrodes 420 in a counterclockwise direction. In some embodiments, the first coil electrodes 430 may be wound in a clockwise direction. In some embodiments, the number of turns of the first coil electrodes 430 may be about four. In some embodiments, the first coil electrodes 430 may include a first eccentric coil electrode 431 and a second eccentric coil electrode 432. Centers of the first eccentric coil electrode 431 and the second eccentric coil electrode 432 may be different from the center on which the first input electrode 410 is disposed. In some embodiments, the first eccentric coil electrode 431 and the second eccentric coil electrode 432 may include turns which have different centers from other turns.

In some embodiments, the first and second eccentric coil electrodes 431 and 432 may be turned two times. In some embodiments, each of the first and second eccentric coil electrodes 431 and 432 may include an inner top coil 433, an inner connection electrode 434, and an inner bottom coil 435.

The inner top coil 433 may be connected to the first branch electrode 420. In some embodiments, the inner top coil 433 may be turned one time. The inner top coil 433 may be disposed on the inner bottom coil 435. The inner top coil 433 may have a large top-half-turn 433a and a small top-half-turn 433b. The large top-half-turn 433a may be connected to the first branch electrode 420. The small top-half-turn 433b may have a radius smaller than a radius of the large top-half-turn 433a. For example, the large top-half-turn 433a of the first eccentric coil electrode 431 may be disposed outside the small top-half-turn 433b of the second eccentric coil electrode 432. The small top-half-turn 433b of the first eccentric coil electrode 431 may be disposed inside the large top-half-turn 433a of the second eccentric coil electrode 432. The small top-half-turns 433b of the first and second eccentric coil electrodes 431 and 432 may be rotated one time in an area on the central portion of the substrate W. The large top-half-turns 433a of the first and second eccentric coil electrodes 431 and 432 may be rotated one time outside the small top-half-turns 433b.

The inner connection electrode 434 may be connected between the inner top coil 433 and the inner bottom coil 435. For example, the inner connection electrode 434 may be connected between the small top-half-turn 433b and the inner bottom coil 435. The inner connection electrode 434 may be parallel to the first input electrode 410.

The inner bottom coil 435 may be connected to the first output electrode 440. The inner bottom coil 435 may be turned one time. The inner bottom coil 435 may have a small bottom-half-turn 435a and a large bottom-half-turn 435b. The small bottom-half-turn 435a may be connected to the inner connection electrode 434. The large bottom-half-turn 435b may connect the small bottom-half-turn 435a to the first output electrode 440. The small bottom-half-turn 435a may have a radius smaller than a radius of the large bottom-half-turn 435b. For example, the large bottom-half-turn 435b of the first eccentric coil electrode 431 may be disposed outside the small bottom-half-turn 435a of the second eccentric coil electrode 432. The small bottom-half-turn 435a of the first eccentric coil electrode 431 may be disposed inside the large bottom-half-turn 435b of the second eccentric coil electrode 432. The small bottom-half-turns 435a of the first and second eccentric coil electrodes 431 and 432 may be rotated one time in an area on the central portion of the substrate W. The large bottom-half-turns 435b of the first and second eccentric coil electrodes 431 and 432 may be rotated one time outside the small bottom-half-turns 435a.

Thus, the first and second eccentric coil electrodes 431 and 432 may induce the plasma 301 on the central portion of the substrate W by using the first radio-frequency power 311.

The first output electrodes 440 may connect the large bottom-half-turns 435b of the first and second eccentric coil electrodes 431 and 432 to the first ring electrode 450. For example, the first output electrodes 440 may be parallel to the first input electrode 410 and the inner connection electrode 434. The number of the first output electrodes 440 may be equal to the number of first coil electrodes 430 (e.g., first and second eccentric coil electrodes 431 and 432). In some embodiments, the number of the first output electrodes 440 may be two.

The first ring electrode 450 may connect the first output electrodes 440 to each other. The first ring electrode 450 may connect the first output electrodes 440 to the first capacitors 352. The first ring electrode 450 may be disposed above the first and second eccentric coil electrodes 431 and 432. The first ring electrode 450 may have a width greater than widths of the first and second eccentric coil electrodes 431 and 432. The first ring electrode 450 may isotropically and uniformly induce the plasma 301 on the central portion of the substrate W by using the first radio-frequency power 311.

Referring again to FIG. 4, the second antenna 334 may surround the first antenna 332. The second antenna 334 may be coplanar with the first antenna 332 on the window 130.

Figure 7:
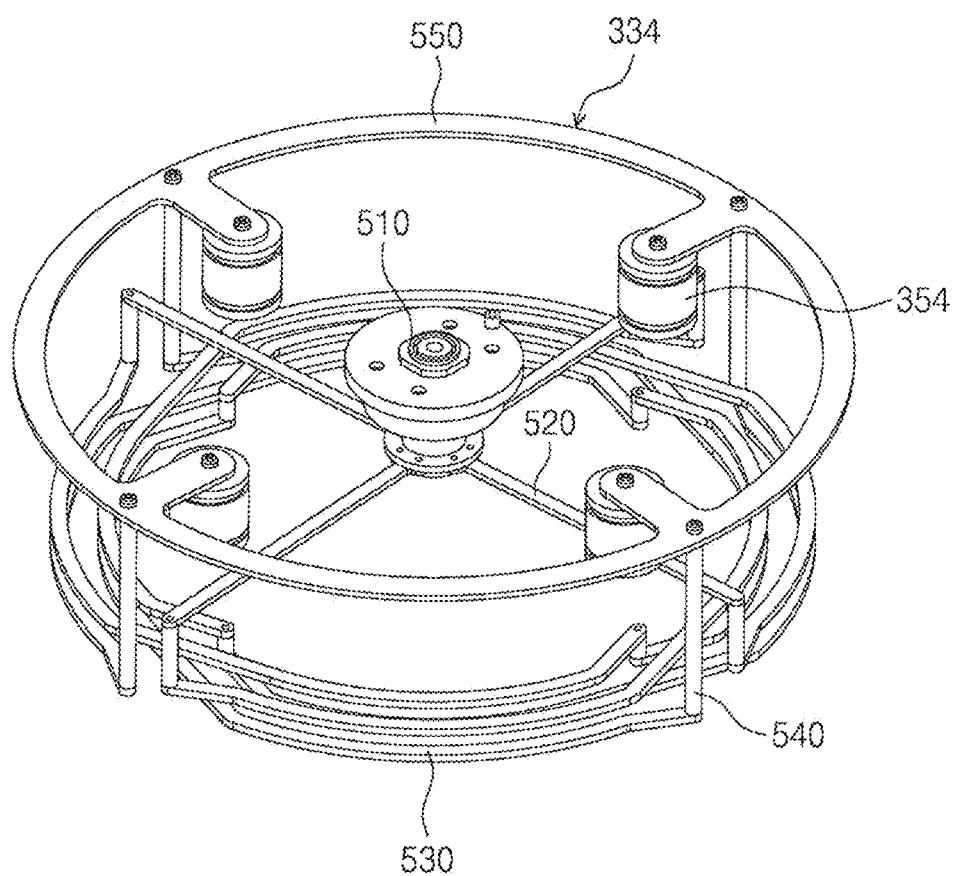
FIG. 7 is a perspective view illustrating the second antenna of FIG. 4.
Figure 8:
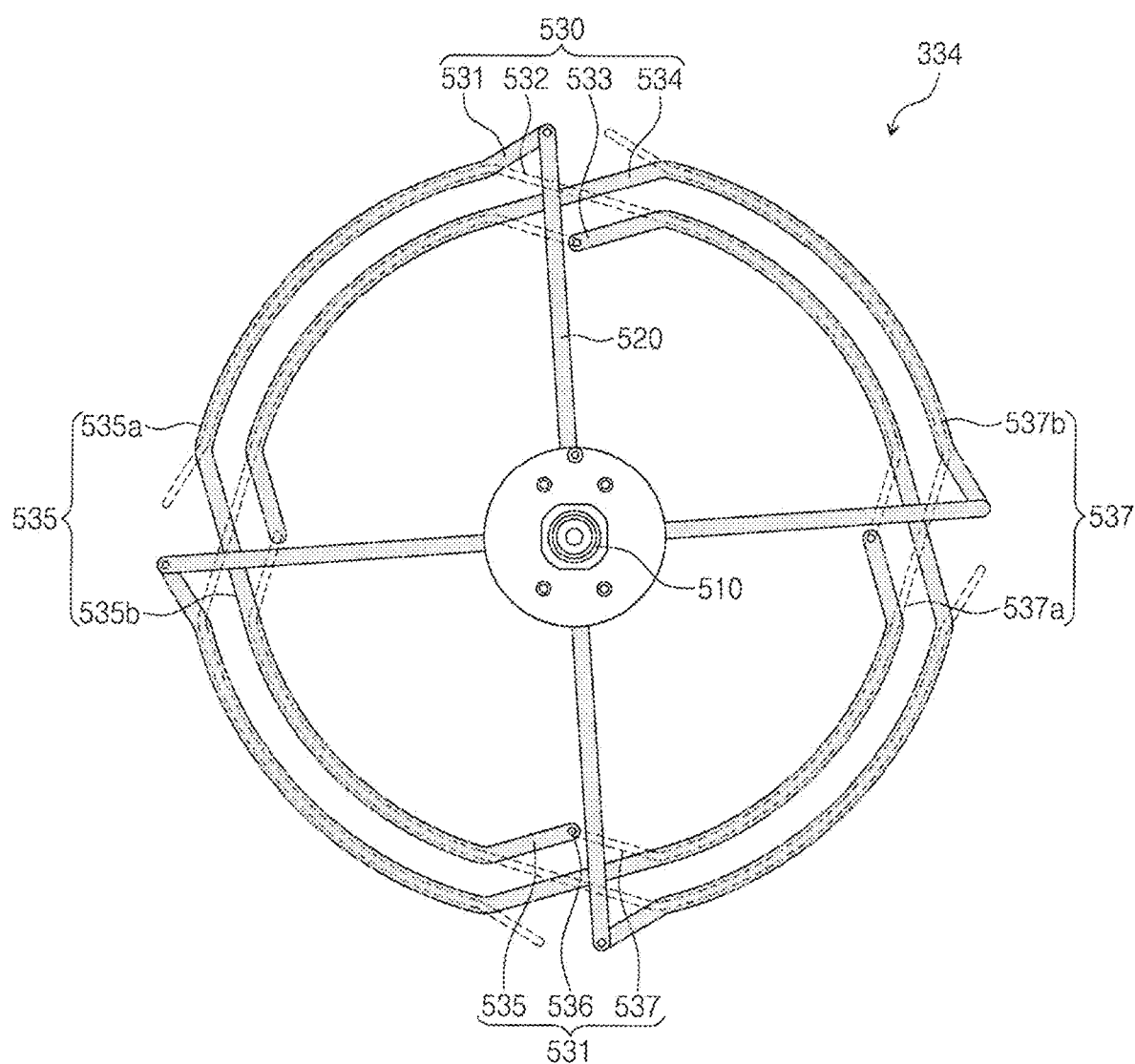
FIG. 8 is a plan view illustrating a second input electrode, second branch electrodes, and second coil electrodes of FIG. 7.

FIG. 7 illustrates the second antenna 334 of FIG. 4. FIG. 8 is a plan view illustrating a second input electrode 510, second branch electrodes 520, and second coil electrodes 530 of FIG. 7.

Referring to FIG. 7, the second antenna 334 may include a second input electrode 510, second branch electrodes 520, second coil electrodes 530, second output electrodes 540, and a second ring electrode 550.

The second input electrode 510 may be disposed at centers of the second branch electrodes 520, the second coil electrodes 530, and the second ring electrode 550. The second input electrode 510 may be disposed around the first input electrode 410 (see FIGS. 4 and 5).

Referring to FIGS. 7 and 8, the second branch electrodes 520 may be connected to the second input electrode 510. For example, the number of the second branch electrodes 520 may be four. In some embodiments, the second branch electrodes 520 may divide the second coil electrodes 530 at a rotation angle of 90 degrees. In some embodiments, respective pairs of the second branch electrodes 520 may extend from the second input electrode 510 in directions opposite to each other.

The second coil electrodes 530 may be connected to the second branch electrodes 520, respectively. The second coil electrodes 530 may extend from outer ends of the second branch electrodes 520 along the second ring electrode 550. The second coil electrodes 530 may surround the first coil electrodes 430. In some embodiments, the number of turns of the second coil electrodes 530 may be equal to the number of the turns of the first coil electrodes 430, though the inventive concepts are not limited thereto. For example, the second coil electrodes 530 may be turned about four times. In some embodiments, the number of turns of the second coil electrodes 530 may be different than the number of the turns of the first coil electrodes 430. In some embodiments, the second coil electrodes 530 may include third to sixth eccentric coil electrodes 531 to 534.

Each of the third to sixth eccentric coil electrodes 531 to 534 may be turned one time. In some embodiments, each of the third to sixth eccentric coil electrodes 531 to 534 may include an outer top coil 535, an outer connection electrode 536, and an outer bottom coil 537.

The outer top coil 535 may be connected to the second branch electrode 520. For example, the outer top coil 535 may be turned a half turn. In some embodiments, the outer top coil 535 may include a large top-quarter-turn 535a and a small top-quarter-turn 535b. The large top-quarter-turn 535a may be connected to the second branch electrode 520. The small top-quarter-turn 535b may connect the large top-quarter-turn 535a to the outer connection electrode 536. The small top-quarter-turn 535b may have a radius smaller than a radius of the large top-quarter-turn 535a. For example, the large top-quarter-turns 535a of the third to sixth eccentric coil electrodes 531 to 534 may be rotated one time along an imaginary circle connecting the outer ends of the second branch electrodes 520. In other words, the large top-quarter-turns 535a of the third to sixth eccentric coil electrodes 531 to 534 may be rotated one time in an area on the edge portion of the substrate W. The small top-quarter-turns 535b of the third to sixth eccentric coil electrodes 531 to 534 may be rotated one time inside the large top-quarter-turns 535a.

The outer connection electrode 536 may connect the outer top coil 535 to the outer bottom coil 537. For example, the outer connection electrode 536 may connect the small top-quarter-turn 535b to the outer bottom coil 537. The outer connection electrode 536 may be parallel to the second input electrode 510.

The outer bottom coil 537 may connect the outer top coil 535 and the outer connection electrode 536 to the second output electrodes 540. The outer bottom coil 537 may be disposed under the outer top coil 535. For example, the outer bottom coil 537 may be turned a half turn. In some embodiments, the outer bottom coil 537 may include a small bottom-quarter-turn 537a and a large bottom-quarter-turn 537b. The small bottom-quarter-turn 537a may connect the outer connection electrode 536 to the large bottom-quarter-turn 537b. The large bottom-quarter-turn 537b may connect the small bottom-quarter-turn 537a to the second output electrode 440. The large bottom-quarter-turn 537b may have a radius larger than a radius of the small bottom-quarter-turn 537a. The small bottom-quarter-turns 537a of the third to sixth eccentric coil electrodes 531 to 534 may be rotated one time in an area on the edge portion of the substrate W. The large bottom-quarter-turns 537b of the third to sixth eccentric coil electrodes 531 to 534 may be rotated one time outside the small bottom-quarter-turns 537a.

Thus, the third to sixth eccentric coil electrodes 531 to 534 may induce the plasma 301 on the edge portion of the substrate W by using the second radio-frequency power 313.

The second output electrodes 540 may connect the large bottom-quarter-turns 537b of the third to sixth eccentric coil electrodes 531 to 534 to the second ring electrode 550. For example, the second output electrodes 540 may be parallel to the second input electrode 510 and the outer connection electrode 536. The number of the second output electrodes 540 may be equal to the number of second coil electrodes 530 (e.g., third to sixth eccentric coil electrodes 531 to 534). In some embodiments, the number of the second output electrodes 540 may be four.

The second ring electrode 550 may connect the second output electrodes 540 to each other. The second ring electrode 550 may connect the second output electrodes 540 to the second capacitors 354. The second ring electrode 550 may be disposed above the third to sixth eccentric coil electrodes 531 to 534. The second ring electrode 550 may have a width greater than widths of the third to sixth eccentric coil electrodes 531 to 534. The second ring electrode 550 may isotropically and uniformly induce the plasma 301 on the edge portion of the substrate W by using the second radio-frequency power 313.

Referring again to FIG. 2, the first and second inductors 342 and 344 may connect the first and second antennas 332 and 334 to the first and second matchers 322 and 324, respectively. The first and second inductors 342 and 344 may be adjacent to each other and may be coupled to each other. The first and second inductors 342 and 344 may have a second mutual inductance $M_2$. In some embodiments, the second mutual inductance $M_2$ may cancel the first mutual inductance $M_1$ between the first and second antennas 332 and 334. In some embodiments, the second mutual inductance $M_2$ may partially or fully offset the first mutual inductance $M_1$. For example, the second mutual inductance $M_2$ may have substantially the same absolute value as the first mutual inductance $M_1$. When the second mutual inductance $M_2$ has a negative value, the first mutual inductance $M_1$ may have a positive value. Alternatively, when the second mutual inductance $M_2$ has a positive value, the first mutual inductance $M_1$ may have a negative value. The first mutual inductance $M_1$ may cause interference between the first and second radio-frequency powers 311 and 313. When the first mutual inductance $M_1$ is reduced and/or canceled by the second mutual inductance $M_2$, the interference between the first and second radio-frequency powers 311 and 313 may be removed and/or reduced. Thus, the first and second matchers 322 and 324 may stably match the impedances of the first and second radio-frequency powers 311 and 313.

In some embodiments, coiled directions and/or a coupled direction of the first and second inductors 342 and 344 may be different from coiled directions and/or a coupled direction of the first and second antennas 332 and 334. The coiled directions of the first and second inductors 342 and 344 may be indicated by the dots of FIGS. 1 and 2. For example, the first and second inductors 342 and 344 may be coiled and/or wound in directions different from each other. In some embodiments, the number of turns of the first inductor 342 may be equal to the number of turns of the second inductor 344. The numbers of the turns of the first and second inductors 342 and 344 may be equal to the numbers of the turns of the first and second antennas 332 and 334. For example, the number of the turns of each of the first and second inductors 342 and 344 may be four.

Figure 9:
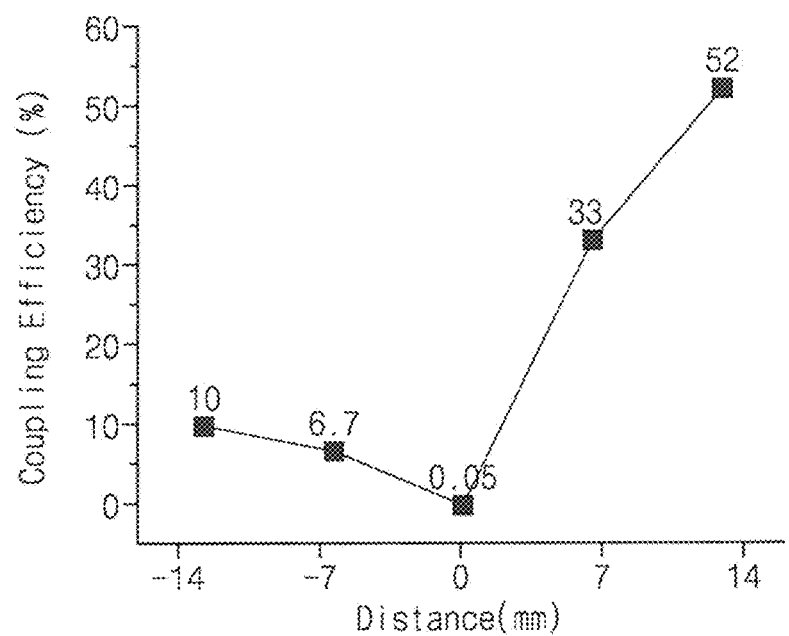
FIG. 9 is a graph illustrating a coupling efficiency according to a distance between first and second inductors of FIG. 2.

FIG. 9 is a graph illustrating a coupling efficiency according to a distance between the first and second inductors 342 and 344 of FIG. 2.

Referring to FIG. 9, a coupling efficiency between the first and second inductors 342 and 344 may be changed when a distance between the first and second inductors 342 and 344 is changed. For example, when the distance between the first and second inductors 342 and 344 is zero (0), the first and second inductors 342 and 344 may have a coupling efficiency of about 0.05%. When the distance between the first and second inductors 342 and 344 is −7 mm or −14 mm in a certain direction (e.g., an x-direction), the first and second inductors 342 and 344 may have a coupling efficiency of about 6% or about 10%. When the distance between the first and second inductors 342 and 344 is 7 mm or 14 mm in a certain direction (e.g., the x-direction), the first and second inductors 342 and 344 may have a coupling efficiency of about 33% or about 52%.

Referring again to FIG. 2, the first capacitor 352 may be connected between the first antenna 332 and ground, and the second capacitor 354 may be connected between the second antenna 334 and ground. The first and second capacitors 352 and 354 may adjust the impedances of the first and second radio-frequency powers 311 and 313 of the first and second antennas 332 and 334. In some embodiments, the first and second capacitors 352 and 354 may remove noise of the first and second radio-frequency powers 311 and 313. For example, each of the first and second capacitors 352 and 354 may have a capacitance of about 50 pF to about 2000 pF. In some embodiments, the first and second capacitors 352 and 354 may control the ignition of the plasma 301.

Figure 10:
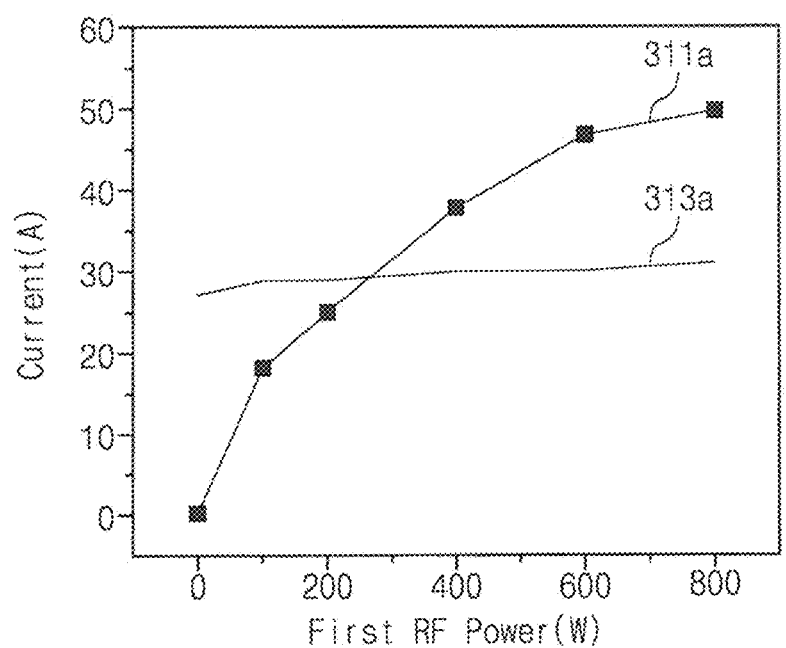
FIG. 10 is a graph illustrating an output current according to the first radio-frequency power of FIG. 2 and an output current according to the second radio-frequency power of FIG. 2.

FIG. 10 is a graph illustrating an output current 311a according to the first radio-frequency power 311 of FIG. 2 and an output current 313a according to the second radio-frequency power 313 of FIG. 2.

Referring to FIG. 10, an output current 313a of the second radio-frequency power 313 may be substantially constant even though the first radio-frequency power 311 increases. For example, an output current 311a of the first radio-frequency power 311 may increase from about 17 A to about 50 A as the first radio-frequency power 311 gradually increases from about 100 W to about 800 W. However, the output current 313a of the second radio-frequency power 313 may be substantially constant in a range of about 27 A to about 30 A even though the first radio-frequency power 311 gradually increases from about 100 W to about 800 W. As used herein, substantially constant with respect to the output current 313a means that the output current 313a may vary within a range of 10 percent or less. The second radio-frequency power 313 may not interfere with the first radio-frequency power 311. In other words, since the first mutual inductance $M_1$ of the first and second antennas 332 and 334 is reduced and/or canceled by the second mutual inductance $M_2$ of the first and second inductors 342 and 344, the second radio-frequency power 313 may be controlled independently of the first radio-frequency power 311.

Figure 11:
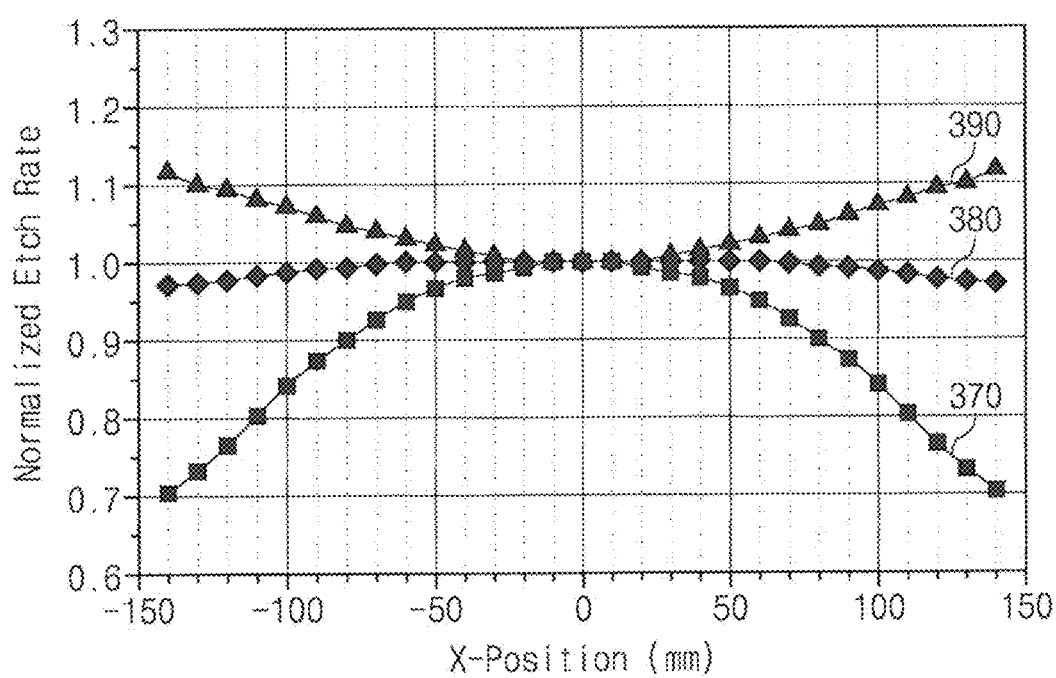
FIG. 11 is a graph illustrating a variation of an etch rate according to a position on a substrate of FIG. 1.

FIG. 11 is a graph illustrating a variation of an etch rate according to a position on the substrate W of FIG. 1.

Referring to FIGS. 1, 2, and 11, an etch rate of an edge of the substrate W may be adjusted according to the second radio-frequency power 313. The etch rate of the edge of the substrate W may be normalized by an etch rate of a center of the substrate W. The first radio-frequency power 311 may be about 600 W. In some embodiments, the first radio-frequency power 311 may be lower than about 600 W. In a case 370 in which the second radio-frequency power 313 is 300 W, the etch rate of the edge of the substrate W may be about 70% of the etch rate of the center of the substrate W. In a case 380 in which the second radio-frequency power 313 is 600 W, the etch rate of the edge of the substrate W may be substantially equal to the etch rate of the center of the substrate W. As used herein, substantially equal with respect to the etch rate means that the etch rate may vary within a range of 5 percent or less. In other words, the second radio-frequency power 313 may be adjusted in such a way that the etch rate of the edge of the substrate W is substantially equal to the etch rate of the center of the substrate W. In a case 390 in which the second radio-frequency power 313 is 900 W, the etch rate of the edge of the substrate W may be about 110% of the etch rate of the center of the substrate W.

Figure 12:
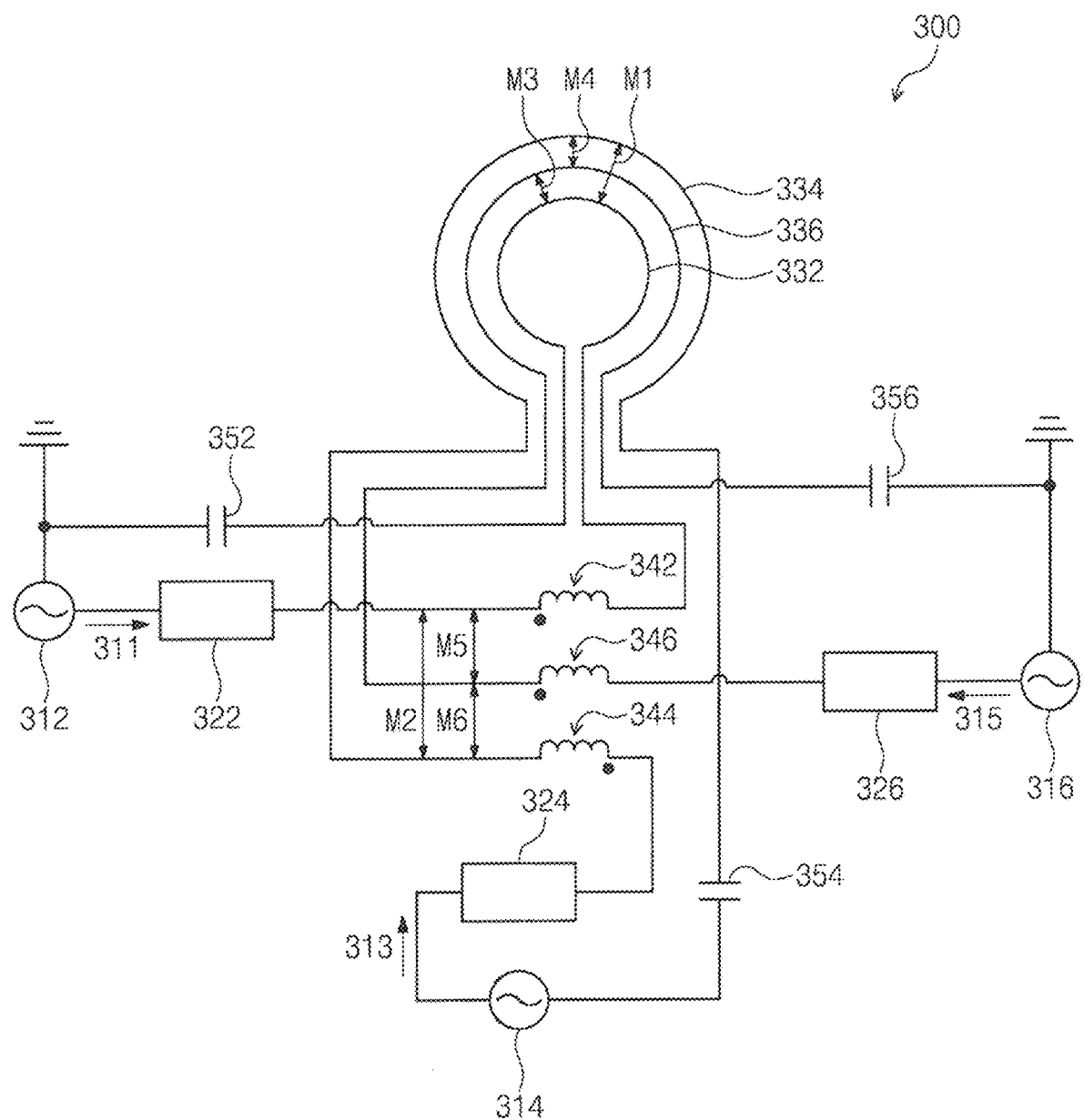
FIG. 12 is a circuit diagram illustrating an example of a plasma generating circuit of FIG. 1.

FIG. 12 is a circuit diagram illustrating an example of a plasma generating circuit 300 of FIG. 1.

Referring to FIG. 12, a plasma generating circuit 300 may further include a third radio-frequency power source 316, a third matcher 326, a third antenna 336, a third inductor 346, and a third capacitor 356. First and second radio-frequency power sources 312 and 314, first and second matchers 322 and 324, first and second antennas 332 and 334, first and second inductors 342 and 344, and first and second capacitors 352 and 354 may be the same as described with reference to FIG. 2.

The third radio-frequency power source 316 may generate a third radio-frequency power 315.

The third matcher 326 may be connected to the third radio-frequency power source 316. The third matcher 326 may match impedance of the third radio-frequency power 315.

The third antenna 336 may generate plasma 301 by using the third radio-frequency power 315. The third antenna 336 may be coupled to the first and second antennas 332 and 334. For example, the third antenna 336 may be disposed between the first and second antennas 332 and 334. Alternatively, the third antenna 336 may be disposed inside the first antenna 332. In certain embodiments, the third antenna 336 may be disposed outside the second antenna 334. The first to third antennas 332, 334, and 336 may have a first mutual inductance $M_1$, a third mutual inductance $M_3$, or a fourth mutual inductance $M_4$. For example, the first and third antennas 332 and 336 may have the third mutual inductance $M_3$. The second and third antennas 334 and 336 may have the fourth mutual inductance $M_4$.

The third inductor 346 may connect the third antenna 336 to the third matcher 326. The third inductor 346 may be turned and/or wound in the same direction as the first inductor 342 or the second inductor 344. For example, the third inductor 346 may be turned and/or wound in the same direction as the first inductor 342. The first and third inductors 342 and 346 may have a fifth mutual inductance $M_5$. The fifth mutual inductance $M_5$ may reduce and/or cancel the third mutual inductance $M_3$. The second and third inductors 344 and 346 may have a sixth mutual inductance $M_6$. The sixth mutual inductance $M_6$ may reduce and/or cancel the fourth mutual inductance $M_4$.

FIGS. 13 to 16 illustrate examples of arrangements of the first to third inductors 342, 344, and 346 of FIG. 11.

Figure 13:
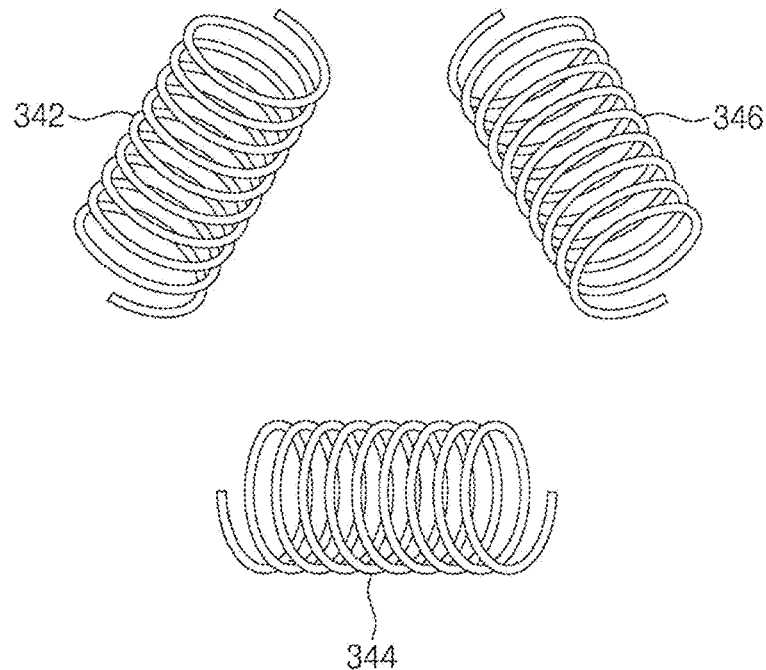
FIGS. 13 to 16 are views illustrating examples of arrangements of first to third inductors of FIG. 11.

Referring to FIG. 13, the first to third inductors 342, 344, and 346 may be arranged in a triangular shape. For example, the first to third inductors 342, 344, and 346 may be disposed at positions corresponding to sides of a regular triangle, respectively.

Figure 14:
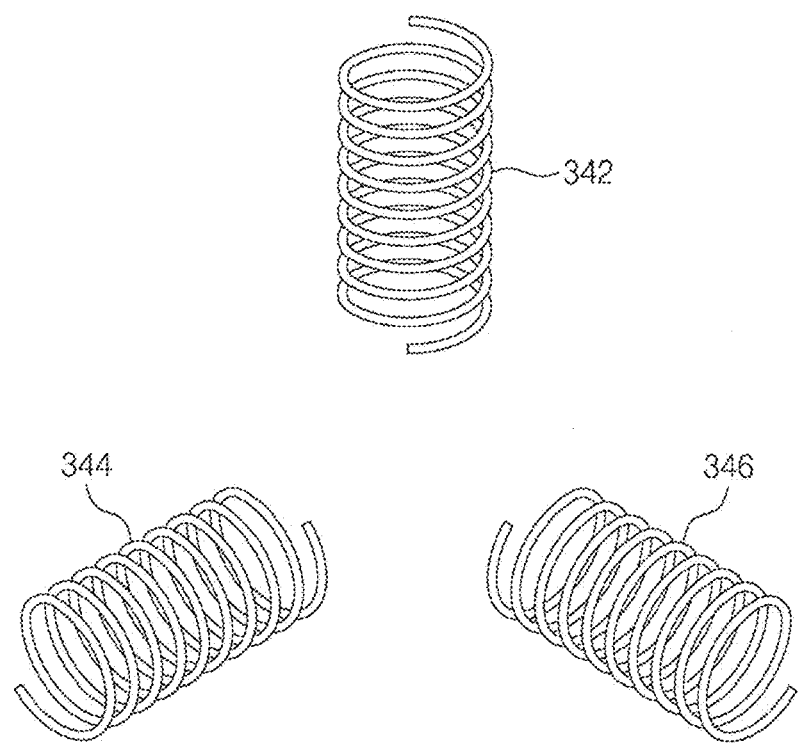

Referring to FIG. 14, the first to third inductors 342, 344, and 346 may be arranged in branch shapes. A divergence angle between respective ones of the first to third inductors 342, 344, and 346 may be about 120 degrees.

Figure 15:
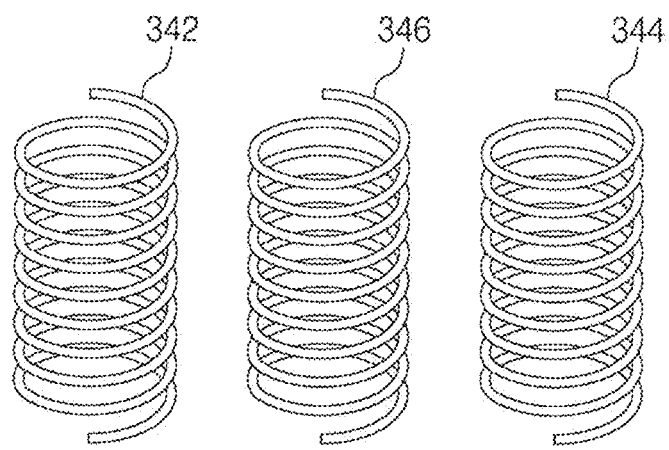

Referring to FIG. 15, the first to third inductors 342, 344, and 346 may be arranged substantially in parallel to each other. In some embodiments, the first to third inductors 342, 344, and 346 may have the same length. Distances between the first to third inductors 342, 344, and 346 may be adjusted.

Figure 16:
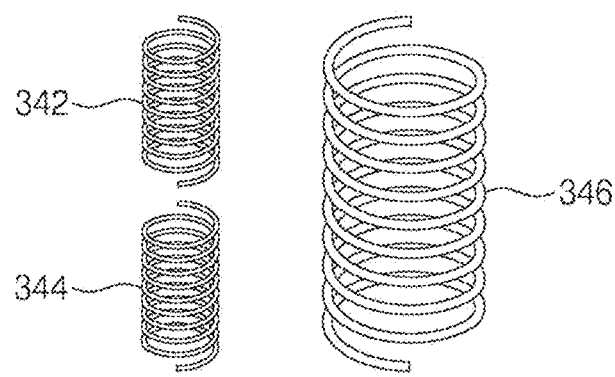

Referring to FIG. 16, the third inductor 346 may be longer than the first and second inductors 342 and 344. When the first and second inductors 342 and 344 are arranged in a line, the third inductor 346 may be disposed side by side with the first and second inductors 342 and 344.

Referring again to FIG. 12, the third capacitor 356 may connect the third inductor 346 to ground. In some embodiments, the third capacitor 356 may connect the third inductor 346 to the third radio-frequency power source 316. In some embodiments, the third capacitor 356 may adjust the impedance of the third radio-frequency power 315. In some embodiments, the third capacitor 356 may remove noise of the third radio-frequency power 315. The third capacitor 356 may have a capacitance of about 50 pF to about 2000 pF. In some embodiments, the third capacitor 356 may control the ignition of the plasma 301.

Figure 17:
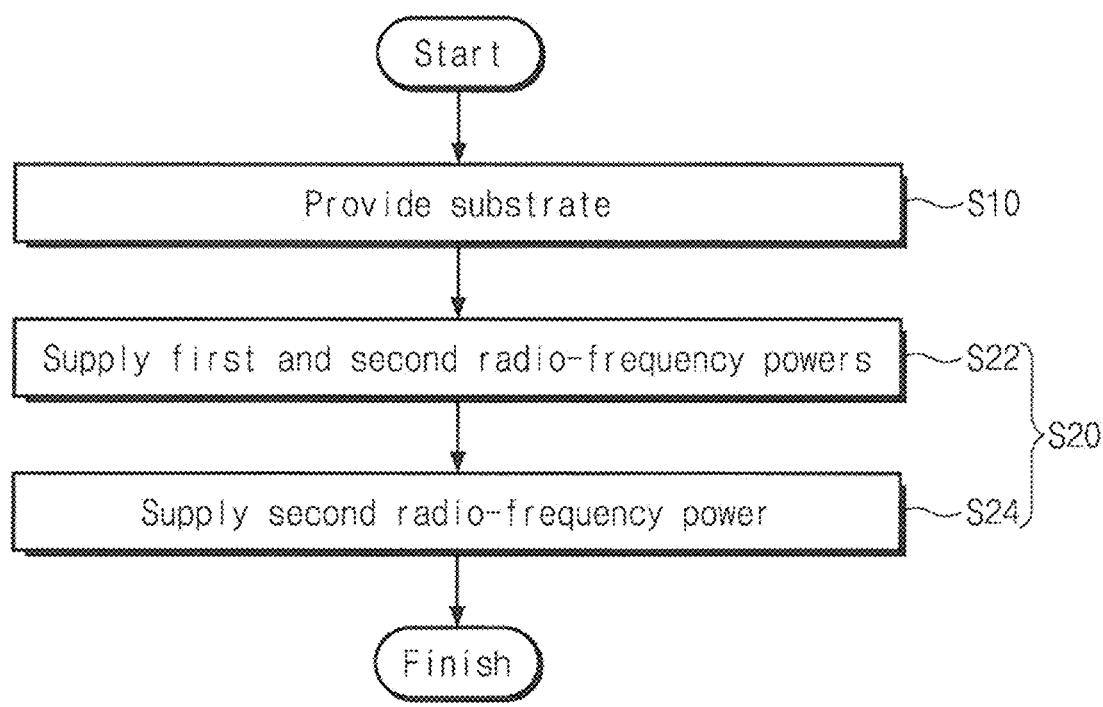
FIG. 17 is a flow chart illustrating methods for manufacturing semiconductor devices using the plasma processing apparatus of FIG. 1.

FIG. 17 is a flow chart illustrating methods for manufacturing semiconductor devices using the plasma processing apparatus of FIG. 1.

Referring to FIGS. 1, 2, and 17, a method for manufacturing a semiconductor device may include providing a substrate W (S10) and generating plasma 301 (S20).

A robot arm (not shown) may provide the substrate W on the electrostatic chuck 140 in the chamber 100 (S10). The substrate W may be provided on the electrostatic chuck 140 after the lower housing 110 and the window 130 are separated from each other. Thereafter, the window 130 and the upper housing 120 may be provided on the lower housing 110.

Next, the plasma generating circuit 300 may generate the plasma 301 on the substrate W (S20). The plasma 301 may be used in an etching process or a thin film deposition process of the substrate W. In some embodiments, generating the plasma 301 (S20) may include supplying first and second radio-frequency powers 311 and 313 (S22) and supplying the second radio-frequency power 313 (S24).

The first and second radio-frequency power sources 312 and 314 may provide the first and second radio-frequency powers 311 and 313 to the first and second antennas 332 and 334 (S22). The first and second radio-frequency powers 311 and 313 may control etch rates or thin film deposition rates of the central portion and the edge portion of the substrate W with little and/or no interference caused by the first mutual inductance $M_1$ of the first and second antennas 332 and 334. The first mutual inductance $M_1$ may be reduced and/or canceled by the second mutual inductance $M_2$ of the first and second inductors 342 and 344. For example, the first radio-frequency power 311 may be proportional to the etch rate of the central portion of the substrate W. The second radio-frequency power 313 may be proportional to the etch rate of the edge portion of the substrate W. Thus, the etching process and/or the thin film deposition process may be stably performed by controlling the first and second radio-frequency powers 311 and 313.

The second radio-frequency power source 314 may supply the second radio-frequency power 313 (S24). The second radio-frequency power 313 may generate plasma 301 on the edge portion of the substrate W. The generated plasma 301 may treat the edge portion and/or a bevel of the substrate W. Polymers may be formed on the edge portion and/or the bevel of the substrate W in the etching process and/or the thin film deposition process. For example, the plasma 301 may etch the polymers on the edge portion and/or the bevel of the substrate W.

Figure 18:
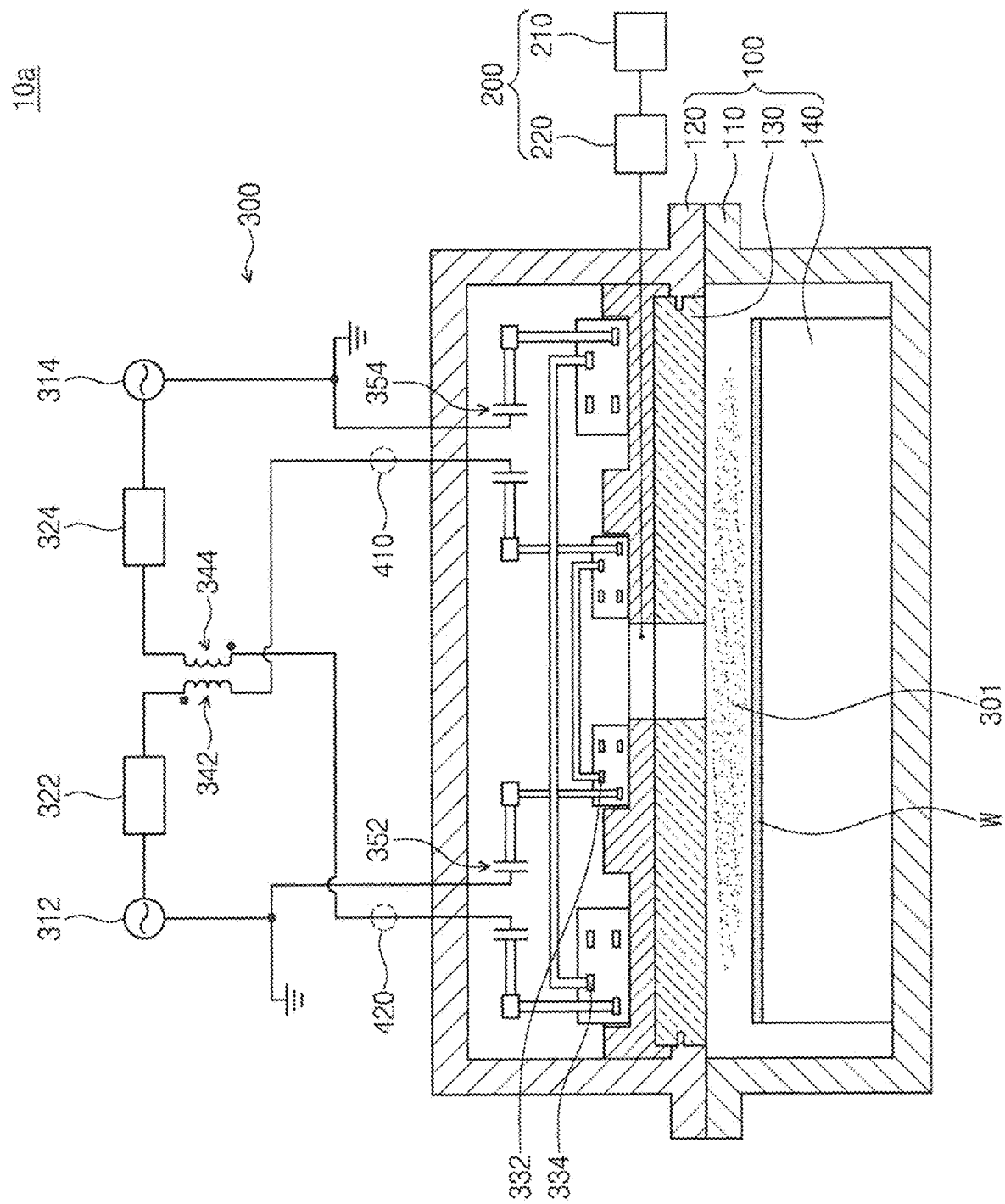
FIG. 18 is a view illustrating a plasma processing apparatus according to some embodiments of the inventive concepts.
Figure 19:
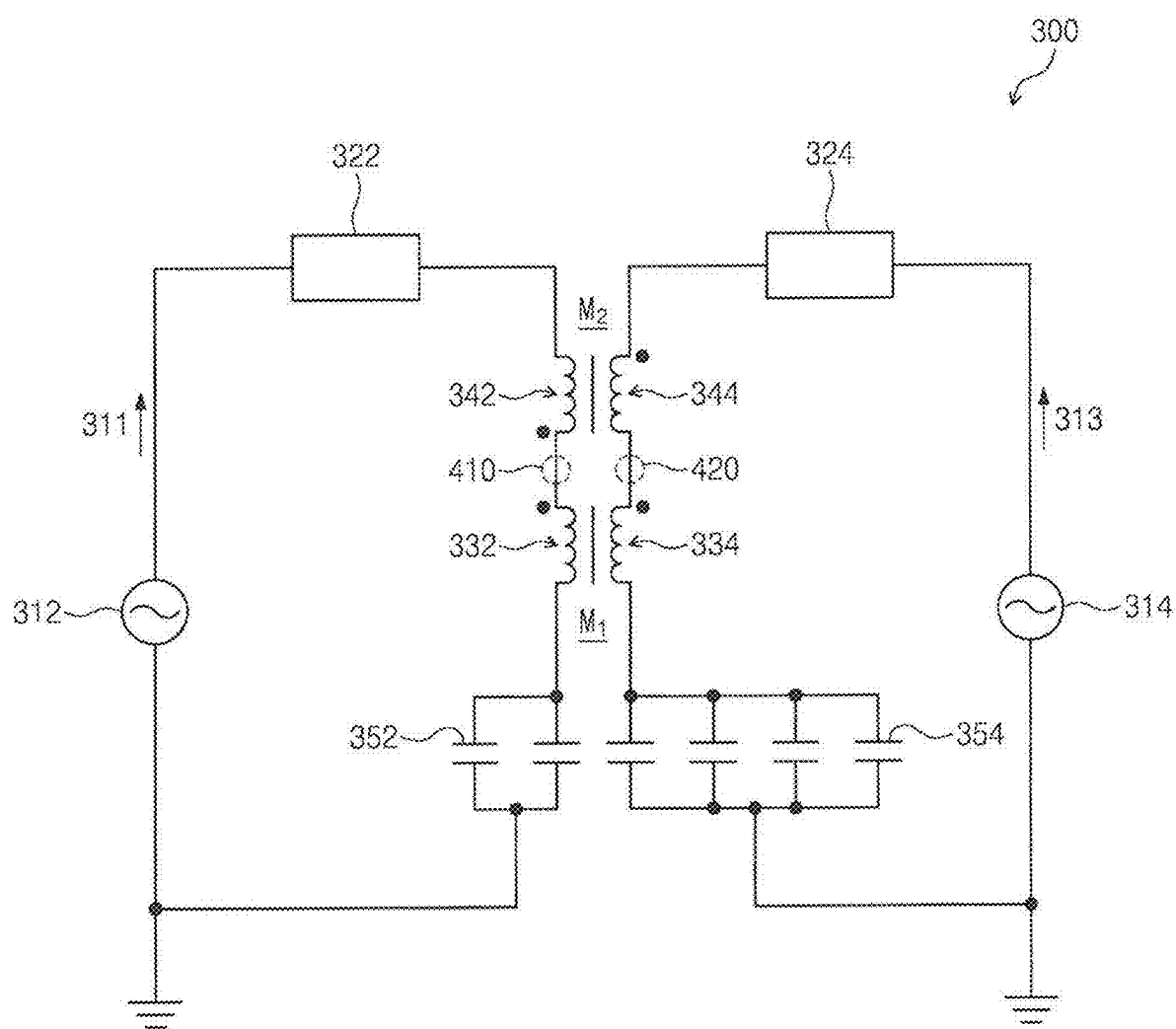
FIG. 19 is a circuit diagram illustrating an example of a plasma generating circuit of FIG. 18.

FIG. 18 illustrates a plasma processing apparatus 10a according to some embodiments of the inventive concepts. FIG. 19 is a circuit diagram illustrating an example of a plasma generating circuit 300 of FIG. 18.

Referring to FIGS. 18 and 19, the plasma processing apparatus 10a according to the inventive concepts may include first and second current measuring instruments 410 and 420. A chamber 100, a gas supply part 200, and a plasma generating circuit 300 of the plasma processing apparatus 10a may be substantially the same as described with reference to FIG. 1.

The first and second current measuring instruments 410 and 420 may be disposed between the first and second antennas 332 and 334 and the first and second inductors 342 and 344, respectively. The first current measuring instrument 410 may measure a first current of the first radio-frequency power 311 in the first antenna 332. The second current measuring instrument 420 may measure a second current of the second radio-frequency power 313 in the second antenna 334.

A controller (not shown) may calculate a current ratio of the first and second currents and a current phase difference at the current ratio. For example, when the current ratio is a standard value and/or the minimum value, the first and second radio-frequency powers 311 and 313 may etch the substrate W without a difference in etch rate between the central portion and the edge portion of the substrate W. A method of eliminating the etch rate difference will be described in more detail through the following method for manufacturing a semiconductor device.

Figure 20:
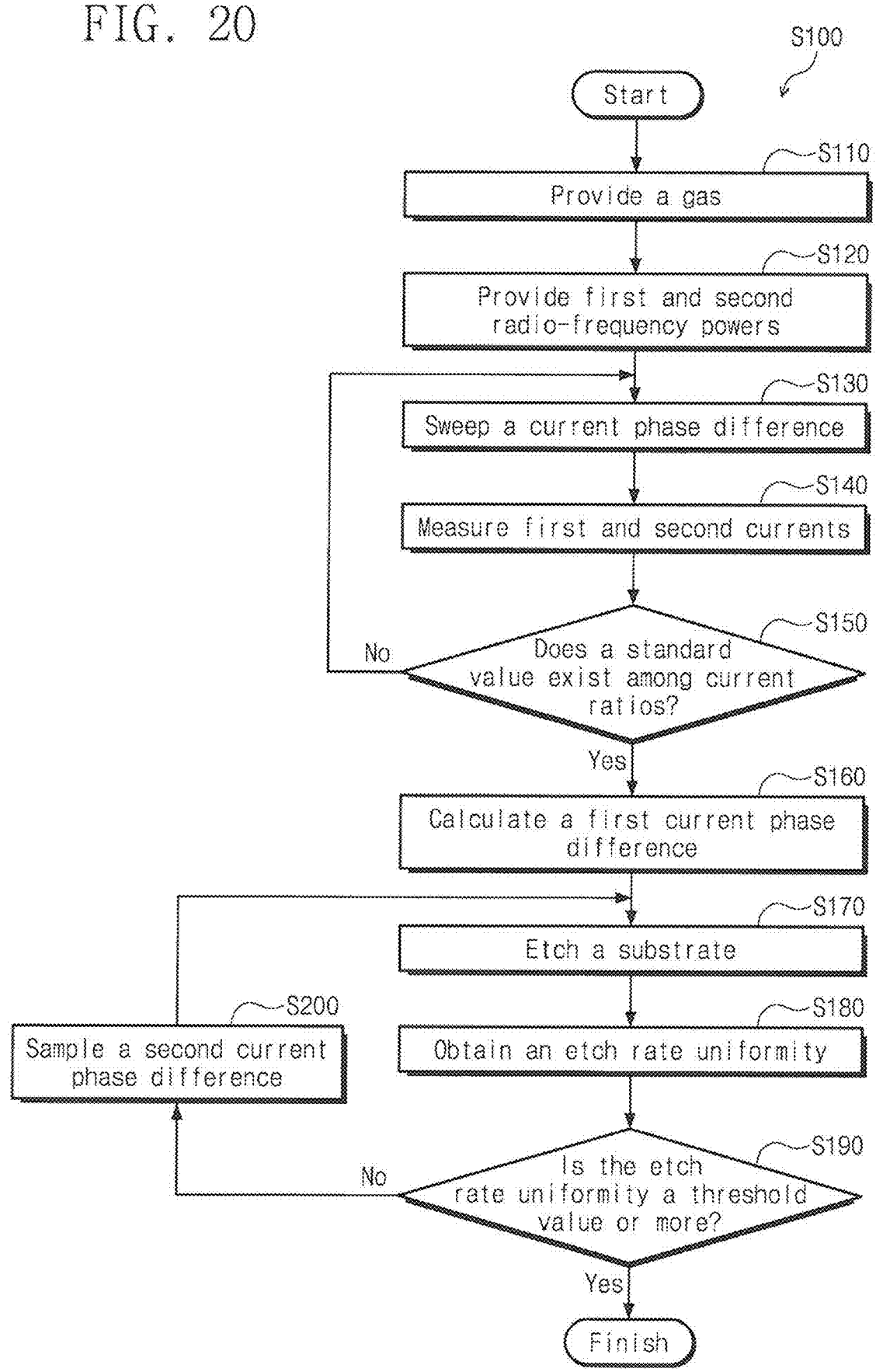
FIG. 20 is a flowchart illustrating a method for manufacturing a semiconductor device using a plasma processing apparatus according to some embodiments of the inventive concepts.

FIG. 20 illustrates a method (S100) for manufacturing a semiconductor device using the plasma processing apparatus 10a according to some embodiments of the inventive concepts. The method for manufacturing a semiconductor device according to the inventive concepts may include an etching method and a deposition method.

Referring to FIGS. 19 and 20, the method (S100) for manufacturing a semiconductor device according to the inventive concepts may include providing a gas (S110), providing first and second radio-frequency powers 311 and 313 (S120), sweeping a current phase difference of the first and second radio-frequency powers (S130), measuring first and second currents (S140), determining whether a standard value exists among current ratios (S150), calculating a first current phase difference (S160), etching a substrate W (S170), obtaining an etch rate uniformity (S180), determining whether the etch rate uniformity is a threshold value or more (S190), and sampling a second current phase difference (S200).

First, the gas supply part 200 provides the gas into the chamber 100 (S110). Before the gas is provided, the substrate W may be provided onto the electrostatic chuck 140 in the chamber 100. The substrate W may include, for example, poly-silicon or a silicon oxide layer. The gas may include at least one of, for example, a nitrogen ($N_2$) gas, a hydrogen ($H_2$) gas, an oxygen ($O_2$) gas, a hydrofluoric acid (HF) gas, a chlorine ($Cl_2$) gas, a sulfur hexafluoride ($SF_6$) gas, a methylene ($CH_3$) gas, or a carbon tetrafluoride ($CF_4$) gas.

Next, the first and second radio-frequency power sources 312 and 314 provide the first and second radio-frequency powers 311 and 313 into the first and second antennas 332 and 334 (S120). The first and second radio-frequency powers 311 and 313 may have the same intensity, the same energy, and/or the same frequency. For example, each of the first and second radio-frequency powers 311 and 313 may have the energy of about 100 W to about 100 KW and the frequency of about 100 KHz to about 100 MHz. When the first and second radio-frequency powers 311 and 313 have the first and second currents of which frequencies are equal to each other and/or of which periods are equal to each other, phases of the first and second currents may be equal to each other. Alternatively, when the first and second radio-frequency powers 311 and 313 have the first and second currents of which frequencies are equal to each other and/or of which periods are equal to each other, the phases of the first and second currents may be different from each other. The first and second radio-frequency powers 311 and 313 having the first and second currents of which the phases are different from each other will be described hereinafter.

Figure 21:
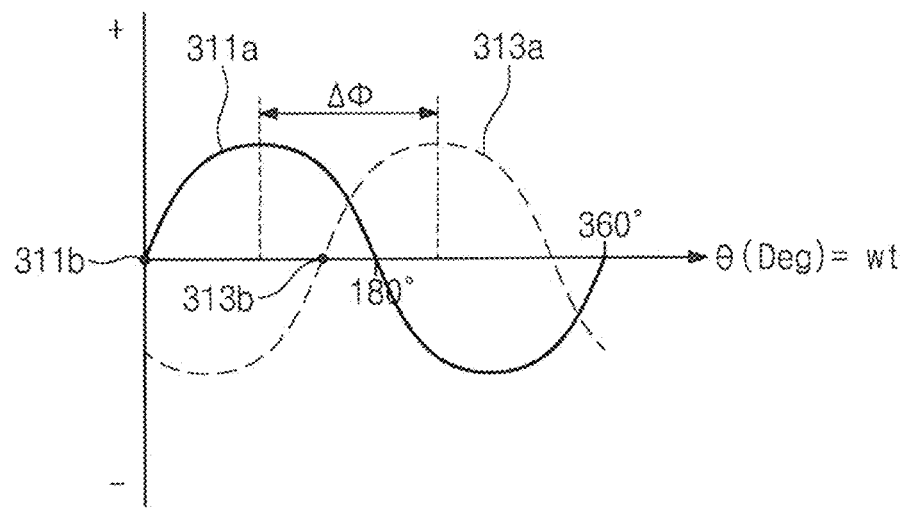
FIG. 21 is a graph illustrating a current phase difference between first and second radio-frequency powers.

FIG. 21 illustrates a current phase difference $\Delta\Phi$ of the first and second radio-frequency powers 311 and 313.

Referring to FIGS. 18 to 21, the first and second radio-frequency power sources 312 and 314 sweep a current phase difference $\Delta\Phi$ of the first and second radio-frequency powers 311 and 313 (S130). The current phase difference $\Delta\Phi$ may be swept in a range from 0 degree to 360 degrees ($2\pi$). The first radio-frequency power 311 may have a first current phase 311a, and the second radio-frequency power 313 may have a second current phase 313a. In addition, the first and second radio-frequency powers 311 and 313 may have the current phase difference $\Delta\Phi$. In some embodiments, the current phase difference $\Delta\Phi$ may be defined as an angle difference between a positive peak of the first current phase 311a and a positive peak of the second current phase 313a. Alternatively, the current phase difference $\Delta\Phi$ may be defined as an angle difference between a node of the first current phase 311a and a node of the second current phase 313a.

Figure 22:
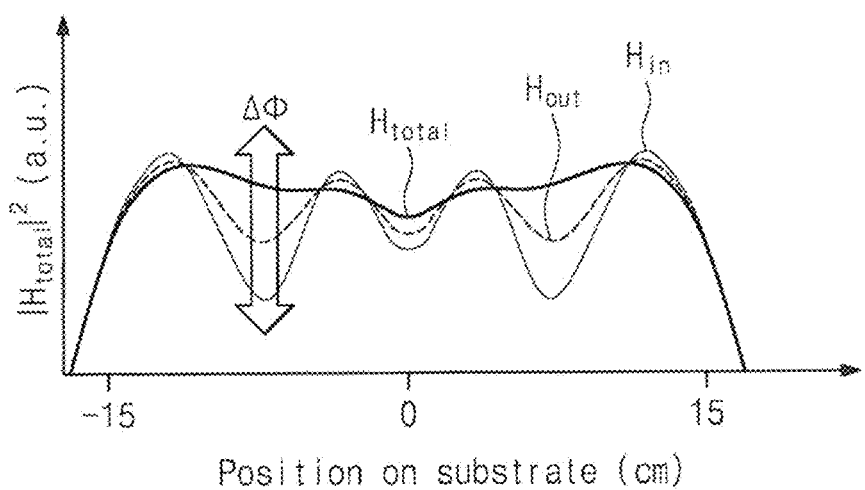
FIG. 22 is a graph illustrating an intensity of an electromagnetic field according to a position on a substrate of FIG. 18.

FIG. 22 illustrates an intensity $|H_{total}|^2$ of an electromagnetic field according to a position on the substrate W of FIG. 18.

Referring to FIG. 22, an intensity $|H_{total}|^2$ of a total electromagnetic field of the substrate W may be calculated as a sum of an intensity $((H_{in})^2)$ of a center electromagnetic field of the substrate W, an intensity ($2H_{in}H_{out} \cos(\Delta\Phi)$) of a mid-zone electromagnetic field of the substrate W, and an intensity $((H_{out})^2)$ of an edge electromagnetic field of the substrate W ($|H_{total}|^2 = (H_{in})^2 + 2H_{in}H_{out} \cos(\Delta\Phi) + (H_{out})^2$). The intensity $|H_{total}|^2$ of the total electromagnetic field may be calculated as the square of the absolute value of the total electromagnetic field ($H_{total}$) of the substrate W, and the intensity $((H_{in})^2)$ of the center electromagnetic field may be calculated as the square of the center electromagnetic field ($H_{in}$). The intensity $((H_{out})^2)$ of the edge electromagnetic field may be calculated as the square of the edge electromagnetic field ($H_{out}$), and the intensity ($2H_{in}H_{out} \cos(\Delta\Phi)$) of the mid-electromagnetic field may be calculated as the product of a constant (e.g., 2), the center electromagnetic field ($H_{in}$), the edge electromagnetic field ($H_{out}$) and a cosine value of the current phase difference $\Delta\Phi$.

If the intensity $((H_{in})^2)$ of the center electromagnetic field is equal to the intensity $((H_{out})^2)$ of the edge electric field, an increase rate (or an decrease rate) of the intensity ($2H_{in}H_{out} \cos(\Delta\Phi)$) of the mid-zone electromagnetic field may be twice an increase rate (or an decrease rate) of the intensity $((H_{in})^2)$ of the center electromagnetic field or the intensity $((H_{out})^2)$ of the edge electromagnetic field on the basis of the current phase difference $\Delta\Phi$. In addition, the intensity ($2H_{in}H_{out} \cos(\Delta\Phi)$) of the mid-zone electromagnetic field may be changed more rapidly than the intensity $((H_{in})^2)$ of the center electromagnetic field or the intensity $((H_{out})^2)$ of the edge electromagnetic field on the basis of the current phase difference $\Delta\Phi$. In some embodiments, when the current phase difference $\Delta\Phi$ is properly adjusted, the intensity ($2H_{in}H_{out} \cos(\Delta\Phi)$) of the mid-zone electromagnetic field may be equal to the intensity $((H_{in})^2)$ of the center electromagnetic field of the substrate W or the intensity $((H_{out})^2)$ of the edge electromagnetic field of the substrate W. The intensity $|H_{total}|^2$ of the total electromagnetic field of the substrate W may be substantially uniform. When the intensity $|H_{total}|^2$ of the total electromagnetic field of the substrate W is substantially uniform, an etch rate difference according to a position on the substrate W may be eliminated. When the substrate W has a radius of about 15 cm, the mid-zone of the substrate W may correspond to a zone between about 5 cm from a center of the substrate W and about 10 cm from the center of the substrate W in a radial direction of the substrate W.

Figure 23:
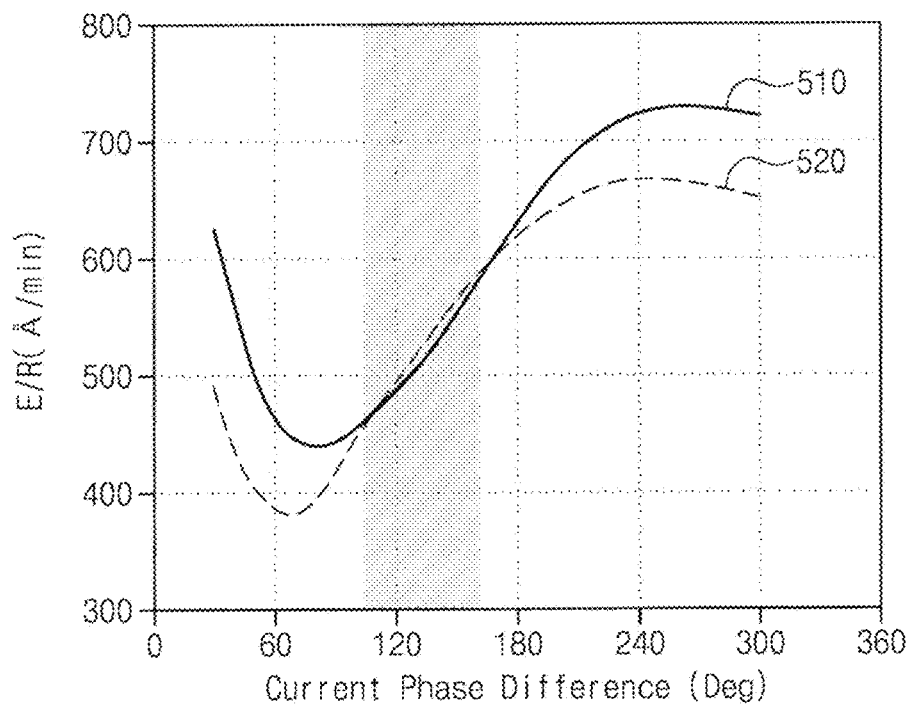
FIG. 23 is a graph illustrating a center etch rate and an edge etch rate of a substrate according to a current phase difference of FIG. 22.

FIG. 23 illustrates a center etch rate 510 and an edge etch rate 520 of the substrate W according to the current phase difference $\Delta\Phi$ of FIG. 22.

Referring to FIG. 23, when the current phase difference $\Delta\Phi$ ranges from about 100 degrees to about 170 degrees, the center etch rate 510 of the substrate W may be approximately equal to the edge etch rate 520 of the substrate W. Even though not shown in the drawings, when the center etch rate 510 is equal to the edge etch rate 520, a mid-zone etch rate of the substrate W may be approximately equal to the center etch rate 510 or the edge etch rate 520. The mid-zone etch rate of the substrate W may correspond to an etch rate on the mid-zone between the center and the edge of the substrate W.

Figure 24:
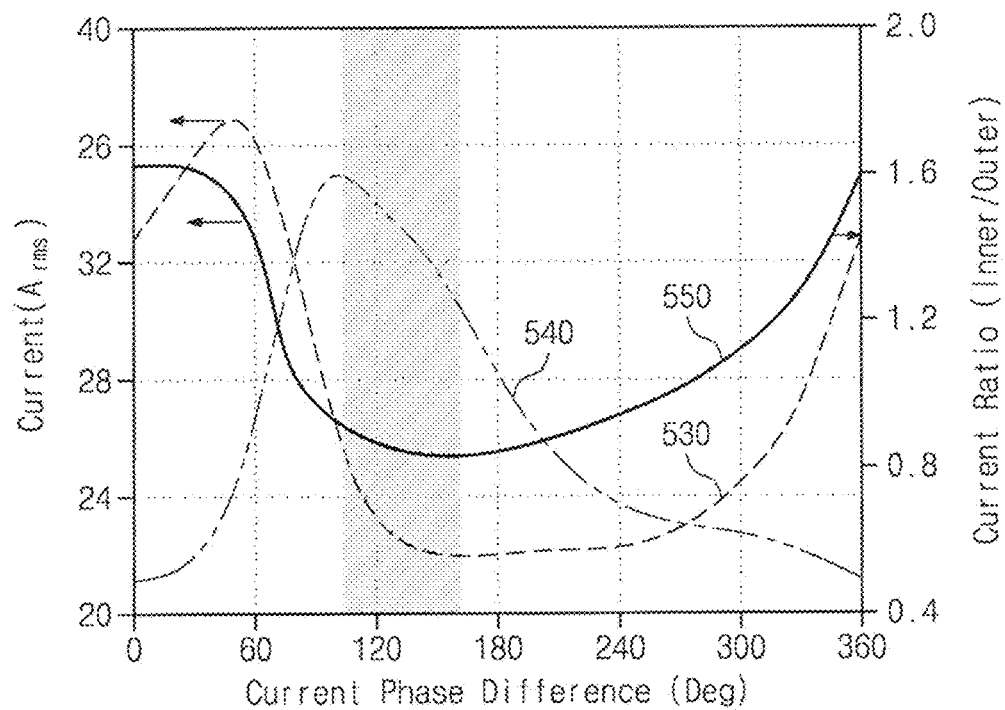
FIG. 24 is a graph illustrating first and second currents in first and second antennas according to the current phase difference of FIG. 22 and a current ratio of the first and second currents.

FIG. 24 illustrates first and second currents 530 and 540 in the first and second antennas 332 and 334 according to the current phase difference $\Delta\Phi$ of FIG. 22 and a current ratio 550 of the first and second currents 530 and 540.

Referring to FIGS. 20 and 24, the first and second current measuring instruments 410 and 420 measure the first and second currents 530 and 540, respectively (S140), and the controller (not shown) calculates the current ratio 550. Each of the first and second currents 530 and 540 may be changed in a range of about 20 A to about 40 A. The current ratio 550 may be defined as a value obtained by dividing the first current 530 by the second current 540.

Next, the controller determines whether the standard value and/or the minimum value exist among the current ratios 550 (S150). When the current phase difference ΔΦ ranges from about 100 degrees to about 170 degrees, the current ratio 550 may be about 0.8. 0.8 may be the standard value. Alternatively, the current ratio 550 may be the minimum value. In other words, when the current ratio 550 is the standard value and/or the minimum value, the current phase difference ΔΦ may range from about 100 degrees to about 170 degrees to reduce or eliminate the etch rate difference of FIG. 6.

When the standard value and/or the minimum value does not exist among the current ratios 550 (or in the graph of the current ratio 550), the step S130 of sweeping the current phase difference of the first and second radio-frequency powers 311 and 313, the step S140 of measuring the first and second currents 530 and 540 and the step S150 of determining whether the standard value exists among the current ratios 550 may be performed again.

When the standard value and/or the minimum value exists among the current ratios 550 (or in the graph of the current ratio 550), the controller calculates the first current phase difference of the first and second currents 530 and 540 at the current ratio 550 corresponding to the standard value (S160). The first current phase difference calculated by the controller may range from about 100 degrees to about 170 degrees. The first and second radio-frequency powers 311 and 313 of the first current phase difference may reduce or eliminate the etch rate difference of the substrate W.

Thereafter, the first and second antennas 332 and 334 may etch the substrate W by using the first and second radio-frequency powers 311 and 313 of the first current phase difference calculated (S170). Thus, the first and second radio-frequency powers 311 and 313 having the first current phase difference of the standard value may reduce or eliminate the etch rate difference according to a position on the substrate W.

Subsequently, a measuring apparatus (not shown) may measure an etch rate according to a position on the substrate W, and the controller may obtain the etch rate uniformity of the substrate W (S180). The etch rate uniformity may be obtained as a shape or a percent according to a position on the substrate W.

Figure 25:
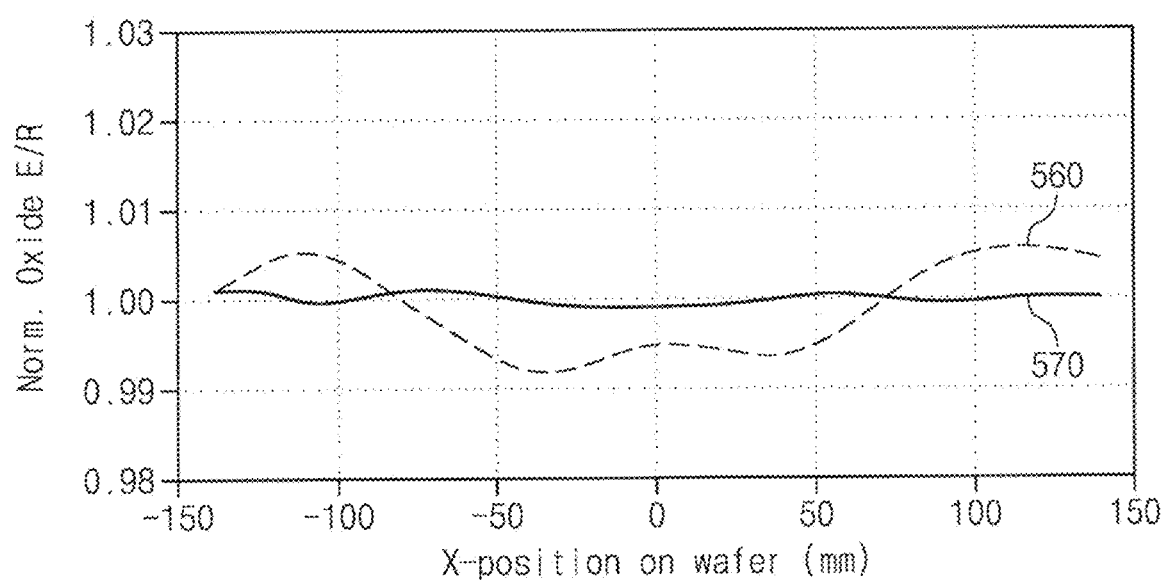
FIG. 25 is a graph illustrating an M-shaped etch rate uniformity and a flat etch rate uniformity of a substrate.

FIG. 25 illustrates an M-shaped etch rate uniformity 560 and a flat etch rate uniformity 570 of the substrate W.

Referring to FIGS. 19, 20, and 25, the first and second radio-frequency powers 311 and 313 controlled to the first current phase difference may etch the substrate W at the substantially flat etch rate uniformity 570 in a diameter direction of the substrate W. The first and second radio-frequency powers 311 and 313 not controlled to the first current phase difference may etch the substrate W at the M-shaped etch rate uniformity 560 in the diameter direction.

Next, the controller determines whether the etch rate uniformity is the threshold value or more (S190). The threshold value may be about 99.5%. When the etch rate uniformity is the threshold value or more, a method of adjusting the etch rate uniformity may be finished. Thereafter, the plasma processing apparatus 10a may etch the substrate W using the first and second radio-frequency powers 311 and 313 having the first current phase difference without the etch rate difference. The substrate W may include a plurality of substrates to be etched.

When the etch rate uniformity is less than the threshold value, the controller may simple a second current phase difference different from the first current phase difference (S200). The second current phase difference may be selected from approximate values of the first current phase difference. For example, the second current phase difference may be selected in the range of about 100 degrees to about 170 degrees. Alternatively, the second current phase difference may be selected in a range of about 0 degree to about 360 degrees.

Thereafter, the first and second antennas 332 and 334 may etch the substrate W by using the first and second radio-frequency powers 311 and 313 having the second current phase difference (S170). The step S170 of etching the substrate W, the step S180 of obtaining the etch rate uniformity, the step S190 of determining whether the etch rate uniformity is the threshold value or more and the step S200 of sampling the second current phase difference may be repeatedly performed until the etch rate uniformity is the threshold value or more. As a result, the method S100 for manufacturing a semiconductor device according to the inventive concepts can reduce or eliminate the etch rate difference of the substrate W.

The plasma generating circuit according to some embodiments of the inventive concepts may include the inductors having the second mutual inductance reducing and/or canceling the first mutual inductance of the antennas. The matchers may stably match the impedances of the first and second radio-frequency powers with little and/or no interference of the first and second radio-frequency powers caused by the first mutual inductance between the antennas. Thus, the antennas may uniformly induce the plasma.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. Thus, the regions illustrated in the figures are schematic in nature, and the shapes of the regions illustrated in the figures are intended to illustrate particular shapes of regions of devices and not intended to limit the scope of the inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A plasma generating circuit comprising:
   first and second radio-frequency power sources configured to generate first and second radio-frequency powers respectively;
   first and second antennas configured to receive the first and second radio-frequency powers to generate plasma, respectively, the first and second antennas disposed next to each other and magnetically coupled to have a first mutual inductance;
   a first matching circuit connected between the first radio-frequency power source and the first antenna;
   a second matching circuit connected between the second radio-frequency power source and the second antenna;
   a first inductor connected in series between the first antenna and the first matching circuit; and
   a second inductor connected in series between the second antenna and the second matching circuit,
   wherein the first and second inductors are disposed next to each other and magnetically coupled to have a second mutual inductance to cancel the first mutual inductances,
   wherein either the first mutual inductance has a positive value and the second mutual inductance has a negative value or the first mutual inductance has a negative value and the second mutual inductance has a positive value,
   wherein each of the first and second antennas comprises:
   an input electrode;
   branch electrodes connected to the input electrode, wherein the branch electrodes are provided in plurality; and
   coil electrodes connected to opposite ends of the branch electrodes, respectively, the coil electrodes extending and connecting the ends of the branch electrodes,
   wherein a number of turns of the coil electrodes of the first antenna is equal to a number of turns of the coil electrodes of the second antenna,
   wherein the coil electrodes are eccentric coil electrodes, and
   wherein each of the eccentric coil electrodes comprises:
   a top coil;
   a connection electrode connected to the top coil; and
   a bottom coil that is connected to the connection electrode and that is under the top coil.

2. The plasma generating circuit of claim 1, wherein the first inductor is turned in an opposite direction to the second inductor, and
   wherein the first antenna is turned in a same direction as the second antenna.

3. The plasma generating circuit of claim 1, wherein the first antenna is inside the second antenna,
   wherein the first antenna comprises two branch electrodes, and
   wherein the second antenna comprises four branch electrodes.

4. The plasma generating circuit of claim 1, wherein each of the coil electrodes of the first antenna is turned two times from the end of the branch electrode to which the coil electrode is connected, and
   wherein each of the coil electrodes of the second antenna is turned one time from the end of the branch electrode to which the coil electrode is connected.

5. The plasma generating circuit of claim 1, wherein each of the first and second antennas further comprises:
   output electrodes that are connected to ends of the coil electrodes; and a ring electrode that is connected to the output electrodes and that is above the branch electrodes and the coil electrodes.

6. The plasma generating circuit of claim 5, further comprising:
first and second capacitors that are connected to the first and second antennas, respectively.

7. The plasma generating circuit of claim 6, wherein the first capacitors are outside the ring electrode of the first antenna and are connected to the ring electrode of the first antenna, and
wherein the second capacitors are inside the ring electrode of the second antenna and are connected to the ring electrode of the second antenna.

8. The plasma generating circuit of claim 1,
wherein the first matching circuit is connected between the first radio-frequency power source and the first inductor,
wherein the second matching circuit is connected between the second radio-frequency power source and the second inductor, and
wherein the first and second matching circuits are configured to match impedances of the first and second radio-frequency powers, respectively.

9. The plasma generating circuit of claim 8, further comprising:
a third antenna between the first and second antennas;
a third radio-frequency power source configured to provide a third radio-frequency power to the third antenna;
a third matching circuit connecting the third antenna to the third radio-frequency power source, the third matching circuit configured to match impedance of the third radio-frequency power; and
a third inductor connected between the third matching circuit and the third antenna,
wherein the first to third antennas have third and fourth mutual inductances,
wherein the first to third inductors have fifth and sixth mutual inductances canceling the third and fourth mutual inductances, and
wherein the first to third inductors are arranged in a triangular shape, in branch shapes, or in parallel to each other.

10. A plasma processing apparatus comprising:
a chamber configured to receive a reaction gas; and
a plasma generating circuit on the chamber, the plasma generating circuit configured to induce plasma of the reaction gas in the chamber,
wherein the plasma generating circuit comprises:
first and second radio-frequency power sources configured to generate first and second radio-frequency powers respectively;
first and second antennas configured to generate the plasma by using the first and second radio-frequency powers, respectively, the first and second antennas disposed next to each other and magnetically coupled to have a first mutual inductance;
a first matching circuit connected between the first radio-frequency power source and the first antenna;
a second matching circuit connected between the second radio-frequency power source and the second antenna;
a first inductor connected in series between the first antenna and the first matching circuit; and
a second inductor connected in series between the second antenna and the second matching circuit,
wherein the first and second inductors are disposed next to each other and magnetically coupled to have a second mutual inductance to cancel the first mutual inductance,
wherein either the first mutual inductance has a positive value and the second mutual inductance has a negative value or the first mutual inductance has a negative value and the second mutual inductance has a positive value,
wherein each of the first and second antennas comprises:
an input electrode;
branch electrodes connected to the input electrode, wherein the branch electrodes are provided in plurality; and
coil electrodes connected to opposite ends of the branch electrodes, respectively, the coil electrodes extending and connecting the ends of the branch electrodes,
wherein a number of turns of the coil electrodes of the first antenna is equal to a number of turns of the coil electrodes of the second antenna,
wherein the coil electrodes are eccentric coil electrodes, and
wherein each of the eccentric coil electrodes comprises:
a top coil;
a connection electrode connected to the top coil; and
a bottom coil that is connected to the connection electrode and that is under the top coil.

11. The plasma processing apparatus of claim 10, wherein the chamber comprises:
a lower housing;
an upper housing on the lower housing; and
a window between the upper housing and the lower housing,
wherein the first antenna is on a central portion of the window, and
wherein the second antenna is on an edge portion of the window.

12. The plasma processing apparatus of claim 11, wherein the plasma generating circuit further comprises:
first and second capacitors respectively connected to the first and second antennas between the window and the upper housing, and
wherein the first and second capacitors ground the first and second antennas to the upper housing.

13. A plasma generating circuit comprising:
first and second radio-frequency power sources configured to generate first and second radio-frequency powers respectively;
first and second matching circuits connected to the first and the second radio-frequency power sources, respectively, the first and the second matching circuits configured to match impedances of the first and the second radio-frequency powers, respectively;
first and second antennas connected to the first and the second matching circuits, respectively, the first and the second antennas configured to generate plasma by using the first and the second radio-frequency powers, respectively, and the first and the second antennas disposed next to each other and magnetically coupled to have a first mutual inductance;
first and second capacitors configured to ground the first and the second antennas, respectively, the first and the second capacitors configured to control impedances of the first and the second radio-frequency powers, respectively; and
first and second inductors connected in series between the first and the second antennas and the first and the second matching circuits, respectively, the first and the second inductors disposed next to each other and magnetically coupled to have a second mutual inductance to cancel the first mutual inductance, wherein either the first mutual inductance has a positive value and the second mutual inductance has a negative value or the first mutual inductance has a negative value and the second mutual inductance has a positive value, wherein each of the first and the second antennas comprises:

an input electrode;

branch electrodes connected to the input electrode, wherein the branch electrodes are provided in plurality; and coil electrodes connected to opposite ends of the branch electrodes, respectively, the coil electrodes extending and connecting the ends of the branch electrodes, wherein a number of turns of the coil electrodes of the first antenna is equal to a number of turns of the coil electrodes of the second antenna, wherein the coil electrodes are eccentric coil electrodes, and wherein each of the eccentric coil electrodes comprises:

a top coil;

a connection electrode connected to the top coil; and a bottom coil that is connected to the connection electrode and that is under the top coil.

14. The plasma generating circuit of claim 13, wherein the first and the second antennas are turned in the same direction.

15. The plasma generating circuit of claim 13, wherein the first and the second inductors are turned in directions different from each other.

16. The plasma generating circuit of claim 13, wherein each of the first and the second antennas further comprises:

output electrodes connected to the coil electrodes; and a ring electrode that is connected to the output electrodes and that is above the coil electrodes.

17. The plasma generating circuit of claim 16, wherein a number of the capacitors is equal to a number of the branch electrodes, and wherein the first and the second capacitors are connected to the ring electrode.

* * * * *